United States Patent
Erickson

(10) Patent No.: US 9,551,743 B2
(45) Date of Patent: Jan. 24, 2017

(54) APPARATUS AND METHOD FOR COMBINED MICRO-SCALE AND NANO-SCALE C-V, Q-V, AND I-V TESTING OF SEMICONDUCTOR MATERIALS

(75) Inventor: Andrew N. Erickson, Santa Barbara, CA (US)

(73) Assignee: DCG SYSTEMS, INC., Fremont, CA (US)

(*) Notice: Subject to any disclaimer, the term of this patent is extended or adjusted under 35 U.S.C. 154(b) by 1278 days.

(21) Appl. No.: 13/398,681

(22) Filed: Feb. 16, 2012

(65) Prior Publication Data

US 2012/0146669 A1 Jun. 14, 2012
US 2016/0216314 A9 Jul. 28, 2016

Related U.S. Application Data

(62) Division of application No. 11/779,282, filed on Jul. 18, 2007, now abandoned.
(Continued)

(51) Int. Cl.
G01R 27/26 (2006.01)
G01R 1/067 (2006.01)
(Continued)

(52) U.S. Cl.
CPC ......... *G01R 31/2648* (2013.01); *G01Q 60/30* (2013.01); *G01Q 60/38* (2013.01);
(Continued)

(58) Field of Classification Search
CPC ........ G01R 31/312; G01R 27/26; H01L 22/14
See application file for complete search history.

(56) References Cited

U.S. PATENT DOCUMENTS 3,345,567 A 10/1967 Turner et al.
3,842,194 A 10/1974 Clemens
(Continued)

FOREIGN PATENT DOCUMENTS

EP 1686735 A1 8/2006
JP 02-269544 A 11/1990
(Continued)

OTHER PUBLICATIONS

Restriction Requirement for U.S. Appl. No. 11/779,282 dated Jul. 13, 2010.
(Continued)

*Primary Examiner* — Jermele M Hollington
(74) *Attorney, Agent, or Firm* — Nixon Peabody LLP; Joseph Bach, Esq.

(57) ABSTRACT

Current Voltage and Capacitance Voltage (IV and CV) measurements are critical in measurement of properties of electronic materials especially semiconductors. A semiconductor testing device to accomplish IV and CV measurement supports a semiconductor wafer and provides a probe for contacting a surface on the wafer under control of an atomic Force Microscope or similar probing device for positioning the probe to a desired measurement point on the wafer surface. Detection of contact by the probe on the surface is accomplished and test voltage is supplied to the semiconductor wafer. A first circuit for measuring capacitance sensed by the probe based on the test voltage and a complimentary circuit for measuring Fowler Nordheim current sensed by the probe based on the test voltage are employed with the probe allowing the calculation of characteristics of the semiconductor wafer based on the measured capacitance and Fowler Nordheim current.

14 Claims, 17 Drawing Sheets

Related U.S. Application Data

(60) Provisional application No. 60/807,678, filed on Jul. 18, 2006.

(51) Int. Cl.
*G01R 31/26* (2014.01)
*G01R 31/312* (2006.01)
*G01Q 60/38* (2010.01)
*G01Q 60/30* (2010.01)

(52) U.S. Cl.
CPC ..... *G01R 27/2605* (2013.01); *G01R 31/2601* (2013.01); *G01R 31/312* (2013.01)

(56) References Cited

U.S. PATENT DOCUMENTS

| | | | |
|---|---|---|---|
| 4,101,830 A | 7/1978 | Greig | |
| 4,409,547 A | 10/1983 | Lederman | |
| 4,481,616 A | 11/1984 | Matey | |
| 4,506,184 A | 3/1985 | Siddall | |
| 5,065,103 A | 11/1991 | Slinkman et al. | |
| 5,266,901 A | 11/1993 | Woo | |
| 5,485,097 A | 1/1996 | Wang | |
| 5,564,682 A | 10/1996 | Tsuji | |
| 5,708,222 A | 1/1998 | Yonezawa et al. | |
| 5,739,050 A | 4/1998 | Farnworth | |
| 5,748,002 A * | 5/1998 | Scott et al. | 324/633 |
| 5,869,958 A | 2/1999 | Gallop et al. | |
| 5,874,734 A * | 2/1999 | Elings et al. | 250/307 |
| 5,883,932 A | 3/1999 | Chiba et al. | |
| 6,118,287 A | 9/2000 | Boll et al. | |
| 6,198,300 B1 | 3/2001 | Doezema et al. | |
| 6,222,491 B1 | 4/2001 | Blom | |
| 6,268,740 B1 | 7/2001 | Iida | |
| 6,388,733 B1 | 5/2002 | Hayashi | |
| 6,389,886 B2 * | 5/2002 | Daniels | G01Q 30/10 374/45 |
| 6,437,868 B1 | 8/2002 | Coult et al. | |
| 6,492,827 B1 * | 12/2002 | Mazur et al. | 324/754.08 |
| 6,538,462 B1 * | 3/2003 | Lagowski et al. | 324/762.05 |
| 6,538,719 B1 | 3/2003 | Takahashi et al. | |
| 6,596,115 B1 | 7/2003 | Menschig | |
| 6,779,387 B2 * | 8/2004 | Degertekin | 73/105 |
| 6,888,344 B2 | 5/2005 | Maekawa et al. | |
| 6,891,170 B1 | 5/2005 | Yu et al. | |
| 6,959,481 B2 * | 11/2005 | Moreland et al. | 29/592.1 |
| 6,967,335 B1 | 11/2005 | Dyer et al. | |
| 6,972,582 B2 | 12/2005 | Howland et al. | |
| 6,999,162 B1 | 2/2006 | Takahashi | |
| 7,034,563 B1 * | 4/2006 | Souchkov | G01R 31/2831 324/750.23 |
| 7,074,340 B2 | 7/2006 | Lugstein et al. | |
| 7,196,454 B2 | 3/2007 | Baur et al. | |
| 7,220,973 B2 | 5/2007 | Yu et al. | |
| 7,227,140 B2 | 6/2007 | Skidmore et al. | |
| 7,285,778 B2 | 10/2007 | Baur et al. | |
| 7,319,336 B2 | 1/2008 | Baur et al. | |
| 7,675,300 B2 | 3/2010 | Baur et al. | |
| 8,336,188 B2 | 12/2012 | Monteen et al. | |
| 8,800,998 B2 | 8/2014 | Erickson et al. | |
| 2002/0093352 A1 | 7/2002 | Min et al. | |
| 2004/0203178 A1 | 10/2004 | Lee et al. | |
| 2005/0184028 A1 | 8/2005 | Baur et al. | |
| 2006/0025872 A1 | 2/2006 | Glanzer et al. | |
| 2006/0261833 A1 | 11/2006 | Boyle et al. | |
| 2007/0187623 A1 | 8/2007 | Skidmore et al. | |
| 2007/0285648 A1 | 12/2007 | Miyajima et al. | |
| 2008/0078506 A1 | 4/2008 | Verbeck et al. | |
| 2008/0078745 A1 | 4/2008 | Cordell et al. | |
| 2010/0066395 A1 | 3/2010 | Johnson | |
| 2010/0148813 A1 * | 6/2010 | Erickson | G01R 31/312 324/754.03 |

FOREIGN PATENT DOCUMENTS

| | | |
|---|---|---|
| JP | 05-158723 A | 6/1993 |
| WO | 2008/091371 A2 | 7/2008 |
| WO | 2013/184170 A2 | 12/2013 |

OTHER PUBLICATIONS

Restriction Requirement for U.S. Appl. No. 11/779,282 dated Oct. 26, 2010.
Office Action for U.S. Appl. No. 11/779,282 dated Jan. 4, 2011.
Office Action for U.S. Appl. No. 11/779,282 dated Aug. 17, 2011.
Restriction Requirement for U.S. Appl. No. 13/341,777 dated Jun. 26, 2013.
Office Action for U.S. Appl. No. 13/341,777 dated Oct. 3, 2013.
Notice of Allowance for U.S. Appl. No. 13/341,777 dated Apr. 9, 2014.
International Search Report and Written Opinion for PCT/US2007/073729 dated Jul. 23, 2008.
International Preliminary Report on Patentability for PCT/US2007/073729 dated Jan. 20, 2009.
International Search Report and Written Opinion for PCT/US2013/020886 dated Dec. 19, 2013.
International Preliminary Report on Patentability for PCT/US2013/020886 dated Jul. 10, 2014.
Blight, S., "The role of CV profiling in semiconductor characterization", Solid State Technology, vol. 33, No. 4, Apr. 1990, pp. 175-179.
Nicollian, E.H., et al., "MOS (Metal Oxide Semiconductor) Physics and Technology," John Wiley & Sons, Somerset, New Jersey, 1982.

* cited by examiner

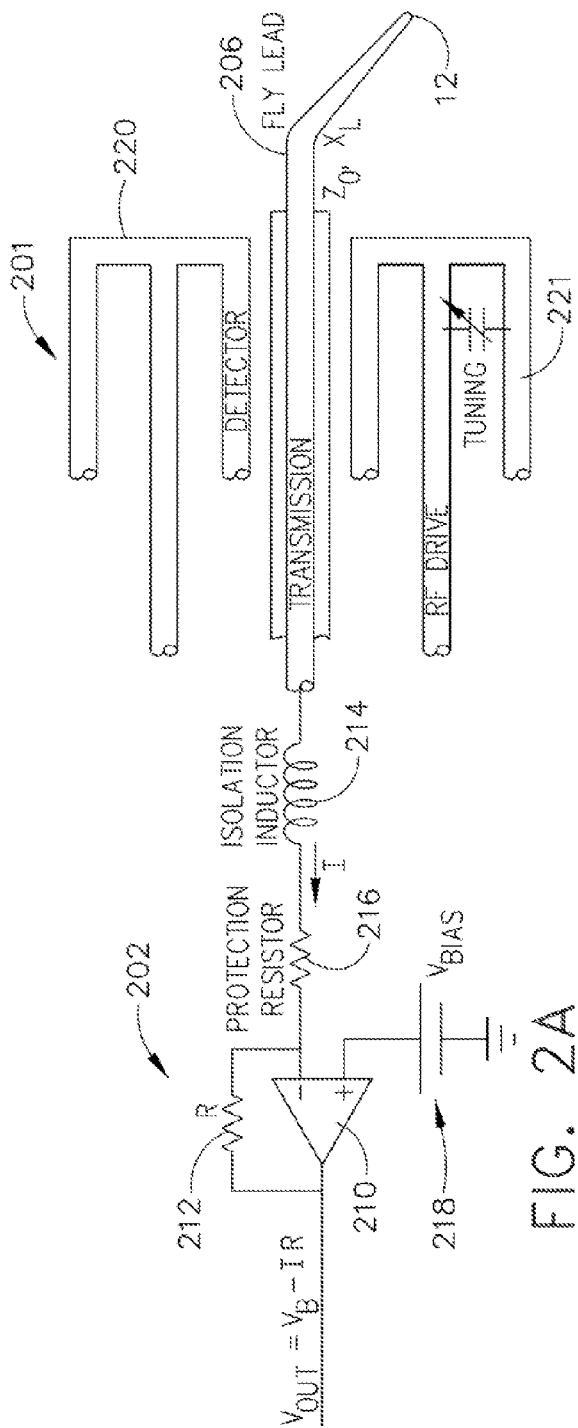
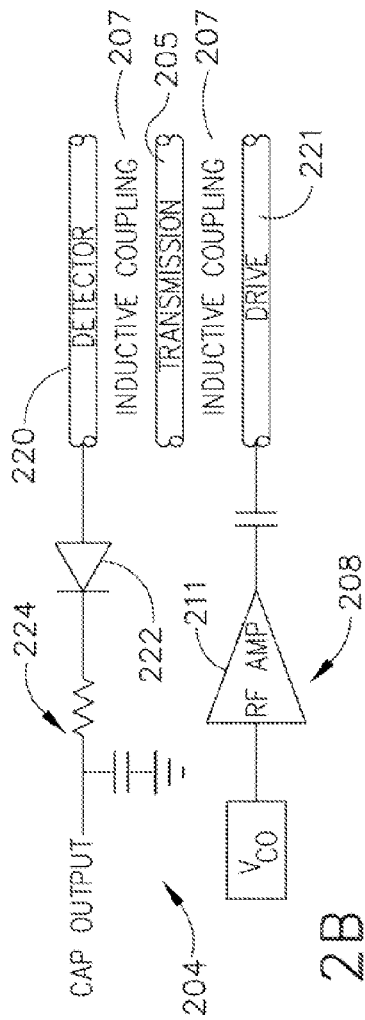
FIG. 2A
FIG. 2B

APPARATUS AND METHOD FOR COMBINED MICRO-SCALE AND NANO-SCALE C-V, Q-V, AND I-V TESTING OF SEMICONDUCTOR MATERIALS

REFERENCE TO RELATED APPLICATIONS

This patent application is a divisional application of U.S. patent application Ser. No. 11/779,282 filed on Jul. 18, 2007 having the same title as the present application and claims the priority of U.S. Provisional Patent Application Ser. No. 60/807,678 filed, on Jul. 18, 2006 having the same title as the present application, the disclosures of which are both incorporated fully herein by reference.

BACKGROUND OF THE INVENTION

1. Field of the Invention

This patent relates generally to the field of electrical characterization of materials and structures and, more particularly, to a non-destructive testing device and method for characterization of semiconductor materials using combined C-V and I-V testing using atomic force probing. It also pertains to the use of multiple probes on a semiconductor device at the nanoscale in order to enable new, novel combinations of measurements of current, charge, and capacitance.

2. Description of the Related Art

It is well known that in the processing and fabrication of semiconductor structures, it is advantageous to measure their performance and properties as early as possible. Furthermore is also well known that parameters such as impurity density and dielectric properties are critical in modern semiconductor devices. The ability to measure these properties on real devices dimensions on the nanoscale is also of great benefit.

There are many methods for accomplishing these measurements. One of these methods for measuring device properties is Capacitance Voltage spectroscopy or CV. Another common measurement is Current Voltage spectroscopy or IV. IV spectroscopy is accomplished by biasing one or more nodes of a structure and measuring the resulting current flow into those nodes. IV is used to great effect in all levels of device characterization and there are a multitude of instruments design to measure current called source-measurement units or SMU's. Measurements in the range from fempto-amps (fA) to milli-amps are useful. To reach the smallest fA current levels, special techniques of guarding and shielding are required while careful attention needs to be paid to leakage currents and interference from noise sources.

Typically instrumentation for measuring CV requires sufficient size of the capacitor plates such that the measured capacitance is on the order of 10's to 100's of picofarads. The structures must be of a size to provide this much capacitance as shown in the basic Capacitance equation:

$$C = \epsilon A / T$$

Where T is the spacing between the plates, A the area of the plates and $\epsilon$ the dielectric constant of the insulator material between the plates. For Semiconductor and electronic materials the material to be measured usually will include the semiconductor as one of the plates and either poly silicon or metal as the second though certainly it is understood that simple material substitution is implied in this disclosure and that constructions other than the parallel metal oxide silicon structure referred to at present are not beyond the scope of this disclosure. For a structure with a very thin 5 nanometer nitrided oxide insulator and a maximum capacitance of 10 picofarads, the implied size of a square plate would be about 375 μm on a side. The standard method for measuring such a capacitance is to deposit a plate of this area onto a dielectric and then connect a probe to a pad of this size. It is undesirable to construct such test structures on wafers thereby effectively sacrificing them. Furthermore, the deposition process may adversely affect the properties of the device to be measured and therefore make enable the desired measurement.

One method to overcome the requirement of sacrificing wafers or affecting the properties of the device under test is to incorporate the test structure into the normal process of the wafer. Though effective and of great value in detecting the properties, test structures are typically only available for measurement after full processing of the wafer is complete. Furthermore, if local properties of a length scale on the order of much less than the 10 picofarad structure discussed above, then it is advantageous to have a method where the area required for the measurement is a few microns or less. In this case, the capacitance measured will be on the order of fempto farads to atto farads, a reduction of 3 to 6 orders of magnitude.

The present invention is directed at enabling measurement of electrical properties without the required construction of probing pads or the need to wait for complete processing of test structures in order to record said performance. The signal to noise ratio of the measurement is adversely affected by reduction of the sampled area. It is the subject of the present invention to employ novel probe design, novel instruments design, and novel combinations of measurement results in order to overcome the orders of magnitude reduction of signal resulting from the smaller sampled area.

SUMMARY OF THE INVENTION

The invention enabling small scale, localized measurements utilizes novel contacting probe design including shielding, material choices, contact sensing to provide means to place a probe in the predetermined, desired location and allow for the best possible measurement of electrical properties under the probe. The special designs are required because in variance with the standard probing method of merely making electrical contact to a metallic or similar pad with the probe and using the pad construction to define the measurement, the probe itself is used as one plate of the capacitor. In other words, the probe defines the test structure. Therefore the resulting capacitance is very small and on the order of fempto farads to attofarads. In some cases in order to measure such capacitance values with a good enough signal to noise ratio, the probe must be shielded and the field lines may be collimated using the shield of the center core. Furthermore, the well known technique of time averaging is utilized to improve the signal. Also careful cabling and instrumentation calibration is necessary as is well known in the art.

Further enabling the measurement of very small capacitance variations is the combination of other measurements such as current measurements or charge measurements. Novel sensor designs permitting both CV and IV measurements with the resolution required for nanoscale measurements are employed. Furthermore, as will be discussed below, calibration of probes on known samples may assist in overcoming inherent limitations of reduced measurement area.

As the size of the structure measured decreases to far below one micron, the probe may require force feedback of the type utilized in the scanned probe microscopy art in order to protect the sensitive structure measured and the sharp probe tip. Furthermore, as the size of the device becomes nanoscale, capacitance values must be measured in the range below 100 fempto-Farads (fF) down to a few atto-farads (aF). The tiny capacitance measured requires a novel design of sensor if it is to allow for simultaneous or near simultaneous current or charge measurement of the same area or structure. Further, some standard structures such as DRAM capacitors or MOSFET gates have capacitances of approximately 30 fF and 4 fF respectively. Leakage currents in such devices will typically be less than 1 picoamp (pA) down to 10's of fempto-Amps (fA).

Lastly, atomic force probing (AFP) methods using novel probe design incorporating both force feedback enablement and electrical measurement performance properties are required for the best possible nanoscale electrical measurements. AFP instrumentation will permit both repeatable contacts and tight positioning of multiple probes. Use of multiple probes to control CV and IV profiles of devices may be employed.

In an exemplary embodiment, the invention provides for a probe for contacting a surface on a supported wafer. An Atomic Force Microscope or similar positioning device positions the probe to a desired measurement point on the wafer surface. Contact by the probe on the surface is detected and test voltage is supplied to the semiconductor wafer. Capacitance sensed by the probe based on the test voltage is measured and Fowler Nordheim current sensed by the probe based on the test voltage is measured. Characteristics of the semiconductor wafer are then calculated based on the measured capacitance and Fowler Nordheim current.

BRIEF DESCRIPTION OF THE DRAWINGS

These and other features and advantages of the present invention will be better understood by reference to the following detailed description when considered in connection with the accompanying drawings wherein:

FIG. 2A is a schematic diagram of one embodiment of the present invention whereby both current and capacitance are possible to be measured compatibly;

FIG. 2B is an example schematic diagram of a capacitance sensor as modified for incorporation in the present invention;

DETAILED DESCRIPTION OF THE INVENTION

Figure 1:
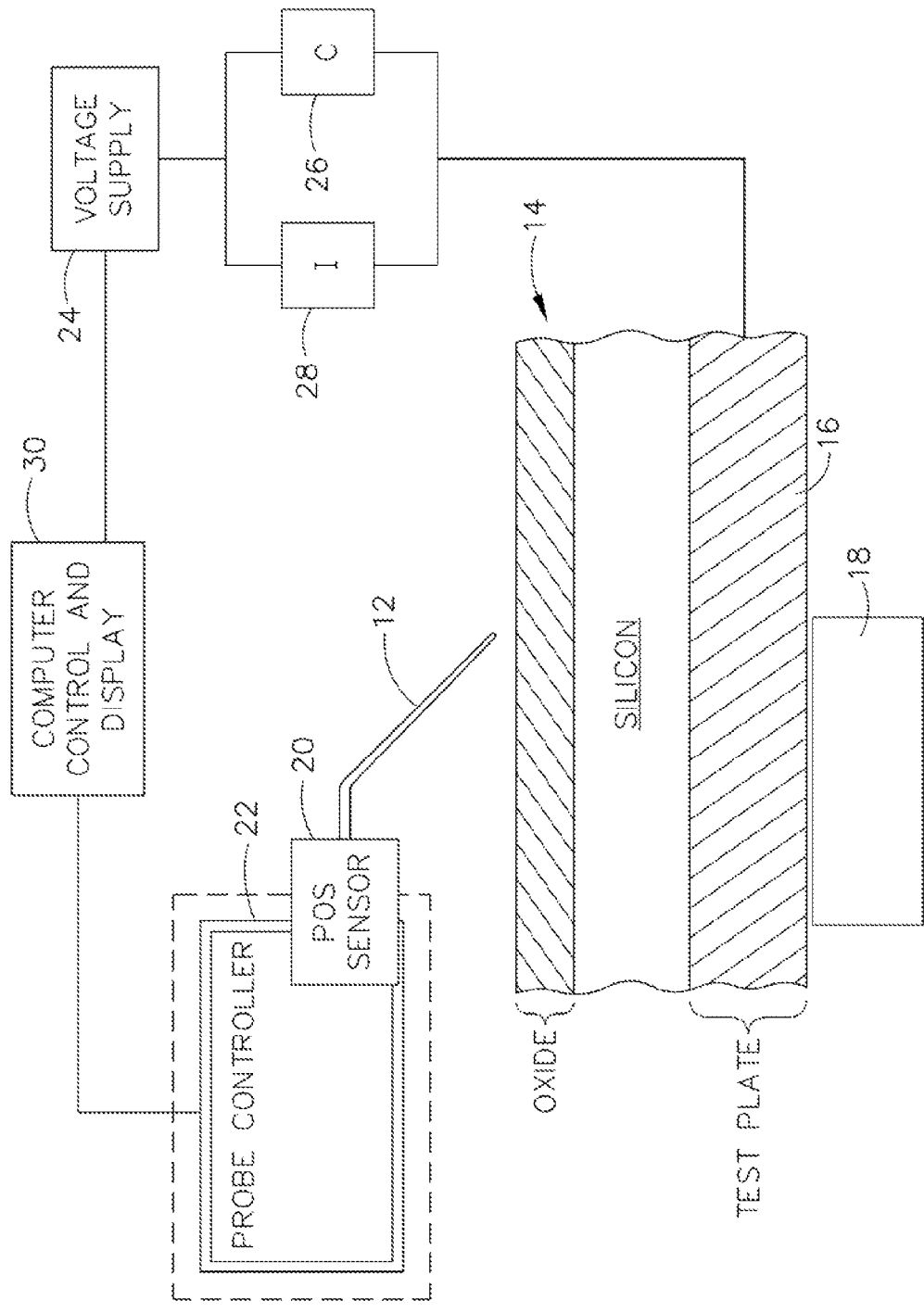
FIG. 1 is Semiconductor tester with Capacitance and Current testing according to the present invention.

Referring to the drawings, FIG. 1 shows schematically the elements of a system 10 embodying the invention. A probe 12 is employed for contact with a semiconductor wafer 14 under test. The wafer is supported by a test plate 16 of a probe station translation stage 18. A position sensor 20 senses the contact by the probe on the semiconductor surface, as will be described in greater detail subsequently. A probe controller 22 such as is disclosed, in U.S. Pat. No. 3,345,567 Turner et. al. which is incorporated into this specification by reference can be used to position the probe with respect to the surface of the semiconductor if the structures to be probed are large enough to be seen optically or if the structure to be probed is uniform such as a semiconductor wafer and precise positioning is not required. If the structure to be probed is too small to be seen with optical microscopes, then a separate means must be employed to locate the feature and position the probe relative to it.

If the structure of the DUT is of sub micron dimension, the feature is located using atomic force microscopy and atomic force probing. Other methods of contacting such structures include alternative microscopy methods whose resolution exceeds optical methods, for example a Scanning Electron Microscope may be used to locate the features of interest. Additional well known techniques for contacting nanoscale features consist of construction of larger contacts with the use of photolithographic techniques or employment of Focused Ion Beam deposition techniques.

In one embodiment of the invention contacting probe(s) incorporate elements for measurement of capacitance between the probe and the extrinsic region of the semiconductor (C-V) and the Fowler Nordheim current (I-V). A voltage supply 24 is employed with a capacitance measuring circuit 26 to conduct the C-V measurement between the probe tip 12 and the doped semiconductor 14. In this embodiment, the structures are large relative to the probe size and therefore, conventional positioning means may be used. A current sensing circuit 28 also connected to the voltage supply measures current for I-V characterization. The measurement circuits are present in alternative embodiments on the probe side of the circuit. A computer control and display system 30 is connected to receive measurements of capacitance from the capacitance measuring circuit for characterization of C-V data and to also receive current measurements from the current sensing circuit for characterization of I-V data for calculation and display. Examples of capacitance-voltage measurement instrumentation and methodology are described in *MOS Physics and Technology*, E H Nicollian and J R Brews; 1982, pp 581-644, ISBN 0-471-08500-6. Such measurements of capacitance-voltage curves are known to those skilled in the art. I-V measurement instrumentation and methodology are described in *Solid-State Electronics Pergamon Press* 1967, Vol 10 pp. 1165-1186 Great Briton. Such measurements of current-voltage curves are known to those skilled in the art. Alternative measurement circuits for capacitance as a function of voltage, time and temperature are known in the art and disclosed in exemplary form in the *manual for the Hewlett Packard Meter model number* 4140B which is hereby incorporated by reference. A computer control and display system also controls the movement of the translation stage and the probe controller.

An implementation of the current invention as will be discussed below in accordance with the requirements for both IV and CV data to be acquired together allows measurement of both RF capacitance and low leakage IV in the same apparatus.

A further improvement over the prior art is shown in the current invention in regards to extremely low capacitance measurements. As discussed above, in order to achieve measurements in the fempto atto farad regime, bridge and charge amplifiers as are well known in the art do not suffice. A method utilizing an RF resonant circuit is the best method as disclosed in U.S. Pat. No. 3,842,194 by J. K Clemens and in the article: J. K. Clemens, "*Capacitive Pickup and the Buried Subcarrier Encoding System for the RCA Video-Disc,*" *RCA Review*, vol. 39, No. 1, March 1978. pp. 33-59. The most sensitive method suited to this type of resonant circuit also suffers from stray leakage and stray capacitance. The fly lead as described in the RCA disclosure has the advantage of being in a housing where the impedance can be controlled; the housing is mostly impractical to implement in a probing environment particularly in combination with force feedback control as in an atomic force microscope or prober. For such instruments, the cantilever and probe are a part of the resonator design and therefore must be carefully designed such that the impedance is constant or varies only at the ¼ wave or ½ wave points as is well known in the art of RF circuit and transmission line design.

It is convenient that elements of the present invention which optimize current measurements may also be seen to improve nanoscale capacitance measurements. That is to say, the guarding for IV and the impedance for CV measurements may be designed carefully such that each is optimized. The guard for an IV measurement becomes the impedance reference for an RF CV measurement if each is properly designed as in the present invention.

For measurements of nanoscale size, the probe contact area and resulting measurement size is at least a factor of ten smaller. For these measurements the required sensitivity for capacitance is on the order of an attofarad. In order to achieve this level of sensitivity, the capacitance measurement circuit is not of the bridge design or charge amplifier of the standard type but must be a specially designed RF resonant circuit as in Clemens. This type of circuit has been used successfully as a transducer to measure topography as in U.S. Pat. No. 4,481,616 by J. R. Matey and in order to deduce semiconductor material impurities as disclosed in U.S. Pat. No. 5,065,103 by Slinkman, et. al. However, this sensor is limited in its ability to be applied to the present invention due to the design constraints imposed due to the circuit design.

FIG. 2A shows one embodiment of the apparatus of the invention. The stripline resonator circuit of Clemens is coupled via isolation inductor 214 to an exemplary current sensing circuit or trans-resistance amplifier 202. The exemplary atto farad capacitance sensing circuit 201 connected through a fly lead 206 to the probe 12 for combined I-V and C-V sensing. In the current sensing circuit, an amplifier 210 may be several stages or a single operational amplifier. Amplifiers of this type are known in the art as source measurement units and may have current limiting, output integration, and variable gain and be controlled by computer interface (not shown). In order to effect measurement, a bias voltage 218 can be applied to one input of the opamp or alternately to the sample under test (not shown). The gain of amplifier is set via the resistor 212 where the output of the amplifier will be the Vout=Vb-IR. A protection resistor 216 can be inserted at the input to limit the current to the DUT.

The frequency isolation between the two circuit blocks 201 and 202 allow both measurements to be performed together. In the prior art, the sensors needed to be changed in order to switch between CV and IV measurements. The two blocks can be isolated from each other because each takes place in a different frequency band where the IV measurement takes place below 1000 Hz and the Capacitance measurement is typically done with two separate frequencies; one for the sensor at about 1 GHz and one for the sample from 1 kHz to 10 MHz.

FIG. 2B shows in greater detail the RF capacitance measurement circuit of the type of Clemens with the variation of using a Voltage Controlled Oscillator 209 and RF amplifier 211 in place of the tuned elements used in the original RCA circuit. The stripline sensor works as follows: The transmission line 205 to the probe tip is driven at or near its resonance frequency by drive trace 221 via inductive coupling 207. The frequency is selected by choosing the VCO 209 operating frequency. The drive amplitude can be selected by changing the gain on RF Amplifier 211. Variations of capacitance at the probe tip will change the resonance frequency of the transmission line and change its oscillation amplitude. The amplitude variation signal is detected by elements Detector Stripline 220, Rectifier 222, and low pass filter 224. The output of the filter corresponds to the capacitance value seen by the probe tip.

In accordance with the present invention, for capacitance measurements, the needle length should be at least 50 um in length and as long as 500 um thereby reducing the capacitance between the lever and the sample. Stray capacitance will lower the Q factor of the resonant circuit and therefore lower its sensitivity as is described in the paper by Matey. Furthermore, the guarding described above may also be designed to control the impedance of the probe wire connection and allow low impedance ground return to the detector portion of the RF capacitance detector thereby improving performance of the system. Impedance control is required in high Q resonant circuit lead and the geometry of the guarding and of the signal line may be chosen to create 50 ohm impedance or any value from 50 ohms and 120 ohms. For the purpose of the present invention it is preferable to have a 80 ohm impedance but for other embodiments, the impedance may be adjusted to suit the physical length of the transmission line length to the probe tip. Lower impedance will give a shorter physical length at resonance in accordance with the following formulation from Clemens:

$\beta = Zl$; where beta is the design parameter for optimization of circuit performance at resonance, Z the impedance, and l the physical length.

In the implementation disclosed in Clemens the ground return property of the detector circuit is between a large area, conductive disk being measured and the housing of the resonant circuit where the capacitance between these two elements is orders of magnitude larger than the capacitance being measured. Therefore, the return path capacitance does not interfere with the measurement. In Slinkman, the return capacitance is not disclosed and in its implementation, left in similar but non-optimal configuration. Slinkman contemplates a doping profiling configuration where in a semiconductor sample free charge under a probe tip is depleted by means of an oscillating bias applied to the semiconductor and the depletion measured by the capacitance sensor of the type disclosed in Clemens. No design consideration is disclosed or contemplated such that the sensor operation including return capacitance and controlled impedance is optimal.

A current limitation of the prior art is the requirement that a sensor similar to the design of Clemens be replaced with a low current to voltage conversion in order to carry out the measurements required for IV. This means that the measurement of a DUT must be stopped and the probe retracted or perhaps replaced while a separate sensor is connected to the measurement instrument. The time and displacement of the measurements is very inconvenient and limits the possibility of performing both IV and CV measurements on identical structures because either the structure will be difficult to navigate to or the sample and or probe tip may degrade during the time lost. It would be ideal if these two or more types of measurements could be performed without changing sensors and even more preferable is they could be performed simultaneously.

Design of grounding and shielding for the purposes of leakage control and impedance control is an element of the present invention. Furthermore, according to the present invention, the lever and probe tip are designed in order to optimize the transmission line impedance. The circuit design of Clemens may be modified in a novel fashion so as to allow low to low leakage IV measurements to be carried out without the requirement to change the probe, sensor, or wiring connections. In this case, the RF housing is connected to the guard potential and driven to the same voltage as the current sensing line. Furthermore, active components within the capacitance sensor such as the RF amp and VCO should be powered down. Lastly, the Drive 220 and Detector 221 lines are also connected to the guard potential. As is well known in the art of low current measurements, having surrounding traces and housings at the same potential as the current sensing line negates the effect of leakage and capacitive discharge that would normally interfere with low current measurement. Using this method helps the strip line sensor of Clemens to not interfere with a low current IV measurement in accordance with the requirements of the present invention.

In accordance with the present invention, the capacitance sensor of Clemens may be modified to limit DC leakage currents by adding guarding to the signal resonant line and inductive or resistive isolation means to isolate the current measurement from the capacitance sensor. As shown in FIGS. 2A and 2B an IV sensor is added to the Capacitance sensor, and isolated from it with an inductor. Because the two measurements are carried out at two different frequencies, they may be isolated from each other and performed in sequence or simultaneously.

The choice of dielectrics used to support the metal foil cantilever used in one of the current embodiments may be chosen to have low leakage and low capacitance. Such design choices may comprise circuit boards designed from Rogers material which has a dielectric constant that is constant with frequency. Ceramic may be chosen because of its low leakage properties and low dielectric constant. Teflon may also be chosen because of its excellent insulating properties.

The stripline resonant sensor described in Clemens suffers from at least two non-idealities: The 915 MHz sensor of Clemens has relatively low Q and it is bulky requiring a volume of about 1×2×1.5 inches. For designs with multiple probes, the bulky resonator limits design of such instruments because the fly lead must be long to allow the sensor housing to be accommodated. A higher frequency design would result in a smaller sensor but the strip line trace geometry cannot be scaled without raising the trace resistance and therefore lowering the Q further. The low Q was originally designed by Clemens to allow the high bandwidth of the video disk player of RCA and the bulkyness of the sensor comes from its relatively low impedance striplines (180 ohms). The stripline design is probably limited to Q's on the order of about 100. In the implementations commercially available for measurements as disclosed in Slinkman or Matey, the Q is typically less than 100. Ideally the sensor designed for the present applications would require less room and have higher Q. Other types of resonators may be used in place of the stripline resonator.

Figure 2C:
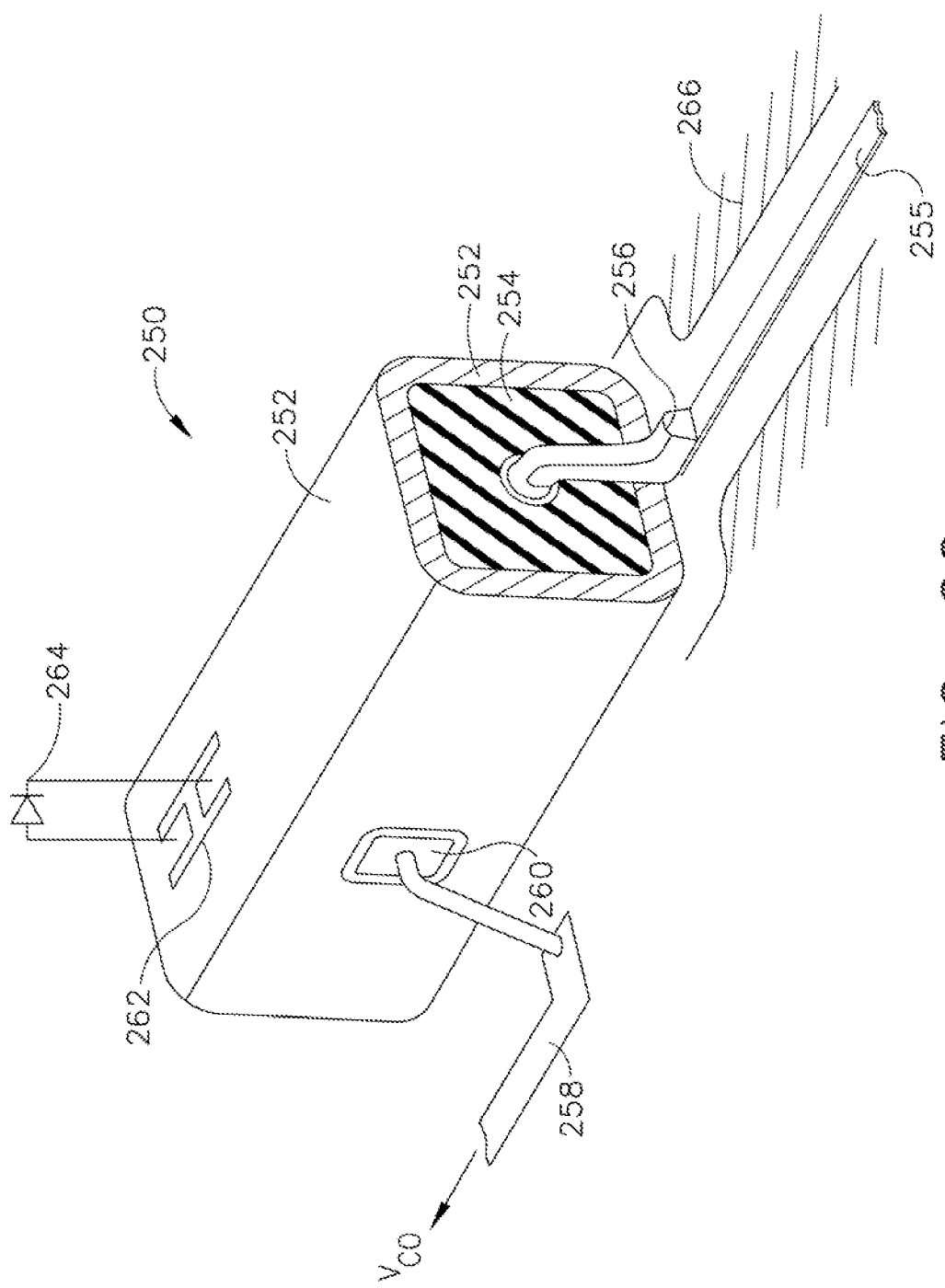
FIG. 2C is an exemplary embodiment of an improved resonant capacitance sensor applied, to the present invention.

In accordance with the present invention, a dielectric resonator (DR) 250 filled with dielectric 254 can be used to create a high Q, small sized sensor as shown in FIG. 2C. For instance a 1 GHz ¼λ resonator of this type is about 1 inch long and ¼ inch in the other two dimensions. Higher frequency resonators will be of even smaller dimensions. A central resonator 256 is connected to the probe tip by transmission line 255 and the resonator and line are surrounded by an RF return 266 which will become a guard for the purpose of IV measurement. The RF return/Guard traces shown may also extend to the underside of the probe transmission line to provide lower impedance. A drive pad 260 and signal pickup 262 are cut into the cladding to allow the VCO trace 258 to couple to the resonator line and measure its amplitude via output 264. The signal pick up and drive pad can either be designed in the production of the DR or can be cut with a abrasive wheel such as a Dremmel tool or equivalent. It is possible to achieve a Q higher than 250 with such a system where the FWHM of the output is less than 4 MHz with a resonant frequency of about 1 GHz.

The significant increase in Q and the reduction in size of the sensor make this a preferred embodiment for nanoscale, multiple probe measurements. An additional benefit of the smaller sensor design is ease of shielding and guarding. The DR outer surface is a complete cladding shield 252 and is held at ground potential. Since the resonator is comprised of an outer shield, dielectric fill, and inner line it is essentially coaxial. Only the potential on the inner surfaces oscillate at its resonant frequency and the exterior remains at a DC potential. In this structure the inner and shield conductors are shorted together and comprise the same DC potential. Furthermore, they may be directly connected to the probe and used as the IV signal trace. In this case, it is not necessary to include a separate inductor to isolate the high frequency signal from the DC since the resonator already accomplishes this. It may be preferable in some designs to isolate the low frequency signals from some interference using methods well known in the art.

This type of DR sensor design is compatible with conventional probing and can be adapted to permit CV and IV for a conventional probe station or other measurement platform such as an electron microscope or biological cell. The present invention should not be construed to be limited to atomic force probing platforms as discussed in the current embodiment.

Figure 3:
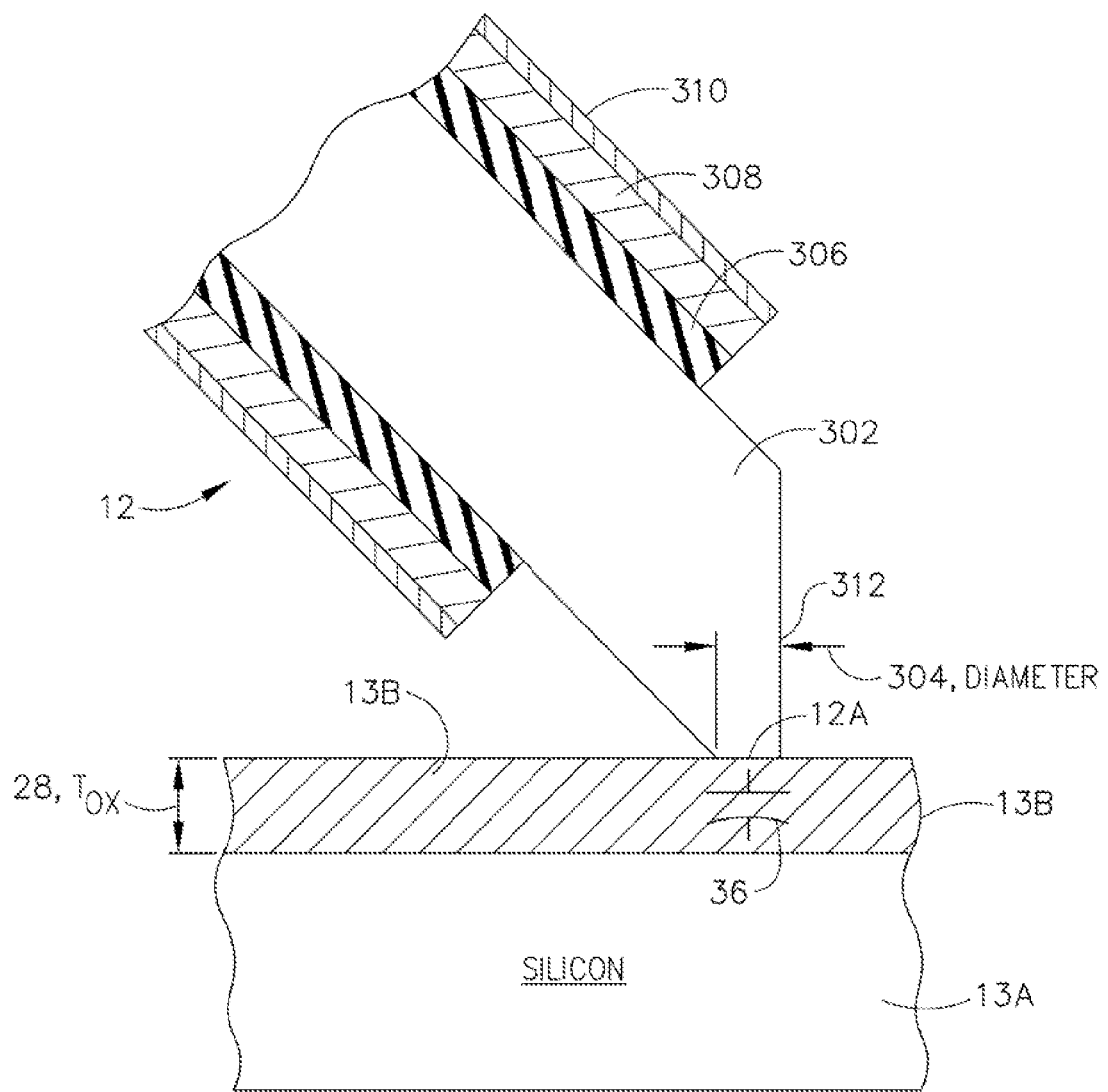
FIG. 3 is an example of an embodiment of the present invention whereby a shielded probe is used to measure properties of a silicon wafer.

FIG. 3 shows an exemplary schematic configuration of the probe 12 in contact with the test surface in greater detail. The probe incorporates a conducting core 302 terminating in a probe tip 304. The core is enclosed by a shield having successive layers of insulating material 306 and conducting material 308 with an insulating outer sheath 310. A coaxial shield, is shown in the exemplary embodiment; however, a triaxial or other multilayer shield may be employed in alternative embodiments. It would be typical to connect the driven guard from a triaxial connection to 308 so that leakage is reduced. Furthermore, for purpose of using the resonant sensor, 308 would become the RF return by the methods discussed in the previous figure. If the contact area is large enough and measured capacitance is in the 100 fF to pF, a bridge type capacitance meter may be used. The probe tip is shown to have a substantially flat tip region but in alternative designs, the end shape may be conical or semi-spherical or other shapes to allow for manufacturing techniques and ideal configurations to allow measurement of the desired structures.

The conducting core has a diameter of less than 0.005 inches and has been fabricated of tungsten in exemplary embodiments. Iridium is employed in alternative embodiments. The material type and work function are allowed for in the measurement methodology so that virtually any material may be chosen. The core material is preferably in a solid phase under standard environmental conditions of operation as opposed, to liquid as in a mercury probe to avoid safety issues and prevent deposition of contaminants on the test surface of the semiconductor after contact by the probe. Mercury probes and methods for their use such as disclosed in U.S. Pat. No. 4,101,830 by Greig and U.S. Pat. No. 4,409,547 by Lederman are well known in the art and, are hereby incorporated in this specification by reference.

The insulating material of the shield in exemplary embodiments is Teflon, nylon, or glass type and the conducting material of the shield is preferably used as a guard served to the same potential as the inner wire. In alternative embodiments, the shield may be grounded. The probe shielding minimizes stray capacitance enabling measurements on the test material in the fempto-Farad (fF) to 100 atto-Farad (aF) range. Exemplary probes incorporating such shielding in the direct contact measurement methodology employed by the present invention have demonstrably provided the most valid C-V data. The shielding also minimizes leakage currents thereby enabling extraction of miniscule current measurements required for the Fowler Nordheim or Frankel Pool I-V measurements described subsequently with respect to FIG. 8.

As shown in FIG. 3, the probe tip 304 in contact with the surface will have an effective diameter 312. While a flat tip is shown, the actual configuration of the tip may be curved. The malleability of the core material will affect the actual surface configuration. More malleable materials have the benefit of providing a slightly larger surface area of contact due to their deformation when brought into engagement with the test surface. However, softer materials are not as durable. Calibration of the probe, as will be described subsequently, establishes an equivalent hypothetical flat plate capacitance for the probe in contact with the test surface.

Figure 4:
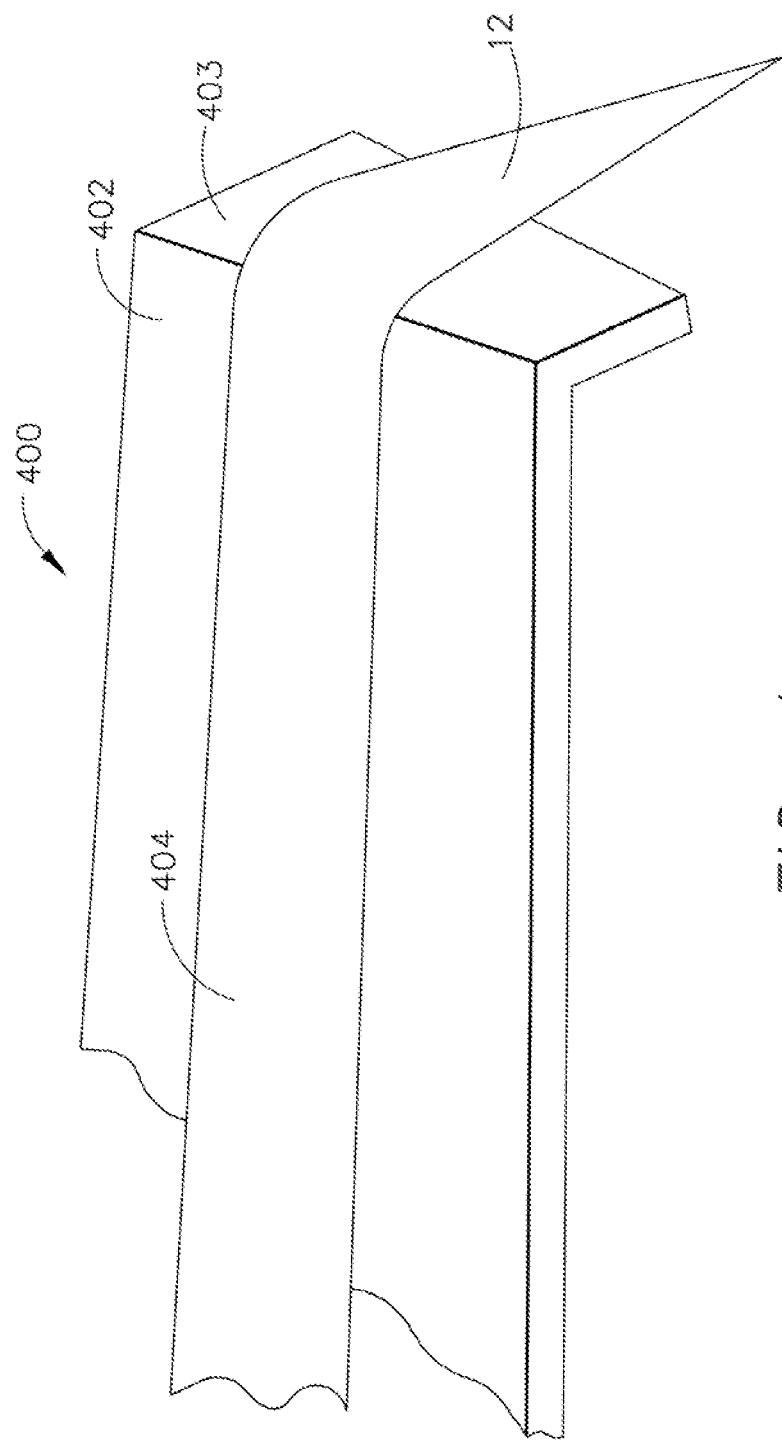
FIG. 4A is an example of an embodiment of a shielded stripline probe compatible with atomic force probing according to the present invention.

In the case of nanoscale structure measurements, alternative embodiments of the probes specified above need to be employed. The probes for such an invention need to have elements to enable force feedback, conductive elements, very sharp probe tip radius. For measurements as will be detailed in this specification, the probe design may need to permit controlled impedance and stripline resonator-like performance to be compatible with special instrumentation enabled in the present invention. FIG. 4A shows an example of a compound stripline probe 400 acting as a resonant element. The bottom cantilever 402 acts in the same way as the shield/guard 266 of FIG. 2C to control the impedance and prevent leakage. Top cantilever 404 is the active sense measurement line and is connected to probe 12. An optional extension 403 extending downward farther shields the probe. The probe Cantilever 404 is spaced up from the bottom cantilever. The width of the top cantilever and spacing from the bottom lever will determine the impedance.

Nanoscale measurements in accordance with the present invention require the use of a driven guard. In prior art nanoscale current measurements as exemplified by McCord in U.S. Pat. No. 728', the probe and its wire connection are of a less favorable type. Although McCord may have contemplated probes and signal connections, the art does not show it nor does any that the inventor is aware of. The primary limitation comes from the probes. The metal coatings over silicon or silicon nitride probes, most common for AFM electrical measurements, are prone to great tip wear. Any exposed silicon on the probe either from tip wear or incomplete coating results is stray field and excess stray capacitance. A preferable probe is made from solid metal with very low DC resistance and no semiconductor material.

The relatively short AFM tips also degrade the performance of the electrical measurements. Furthermore, probe tips of the type in use in the prior art have contact resistances in the range of kilo-ohms and are unsuitable for use in low noise, low leakage nanoscale electrical measurements. Additionally, the wiring used and disclosed in accordance with the prior art method, is also subject to large leakage values on the order of nanoamperes and will be susceptible to interference from noise sources such as line noise. An improvement over the prior art in accordance with the present invention is the use of guarding over the length of the signal path from the DUT to the measurement instrument. This configuration lowers the net DC leakage current from nA per volt to between 1 pA and 1 fA per volt depending upon the quality of the guarding and the cleanliness and quality of the insulation. Furthermore, it is a desirable feature of one embodiment of the present invention to have a long probe needle tip of between 50 um and 500 um. The extended length lowers parasitic stray capacitance and extraneous signal coupling that would interfere with the measurements in the present invention. Additional benefits of this design is the very high entrant angle of the probe which further reduces the large stray capacitances in probe designs of the prior art. Though the use of metallic wire has been disclosed in the prior art as in Slinkman it was not contemplated for low leakage current measurements nor in combination with guarding schemes. The use of solid metal wiring of the type preferred in the present invention also provides excellent conductivity preferably less than 100 ohms.

Additionally, application of AC signals outside of resonant band of the sensor and DC biases may be applied to the resonant sensor line and therefore the probe tip or to the sample. The importance of the choice of bias application is significant as an element of the present invention for in the measurement of micro or nanoscale devices, the local device geometry may prohibit a large scale back contact as is contemplated in the prior art.

The importance of selective application of bias in a sample with small features is contemplated in Alvis et. al. which is hereby incorporated in this specification by reference. In Alvis, this selective contacting is used for the purpose of local profiling of specific device features. The microscope of Slinkman may be combined with the local contact of Alvis to allow selective application to a nanoscale feature. However, the method disclosed in Alvis is restrictive due to the requirement to isolate and contact a predetermined device and then al through a relatively exhaustive sample preparation procedure in order to carry out the invention. Erickson further discloses a similar method requiring sample preparation in order to apply bias to a preselected location but suffers from the need of exhaustive sample preparation methods.

It is an object of the present invention to provide a method where local device structures may be contacted and biased without the use of large area back contacts or predetermined exhaustive sample preparation methods. In one embodiment of the present invention more than one SPM probe is used to contact a micro to nanoscale device. One probe comprises a biasing or return path probe and one probe is attached to a resonant capacitance sensing circuit.

Figure 16:
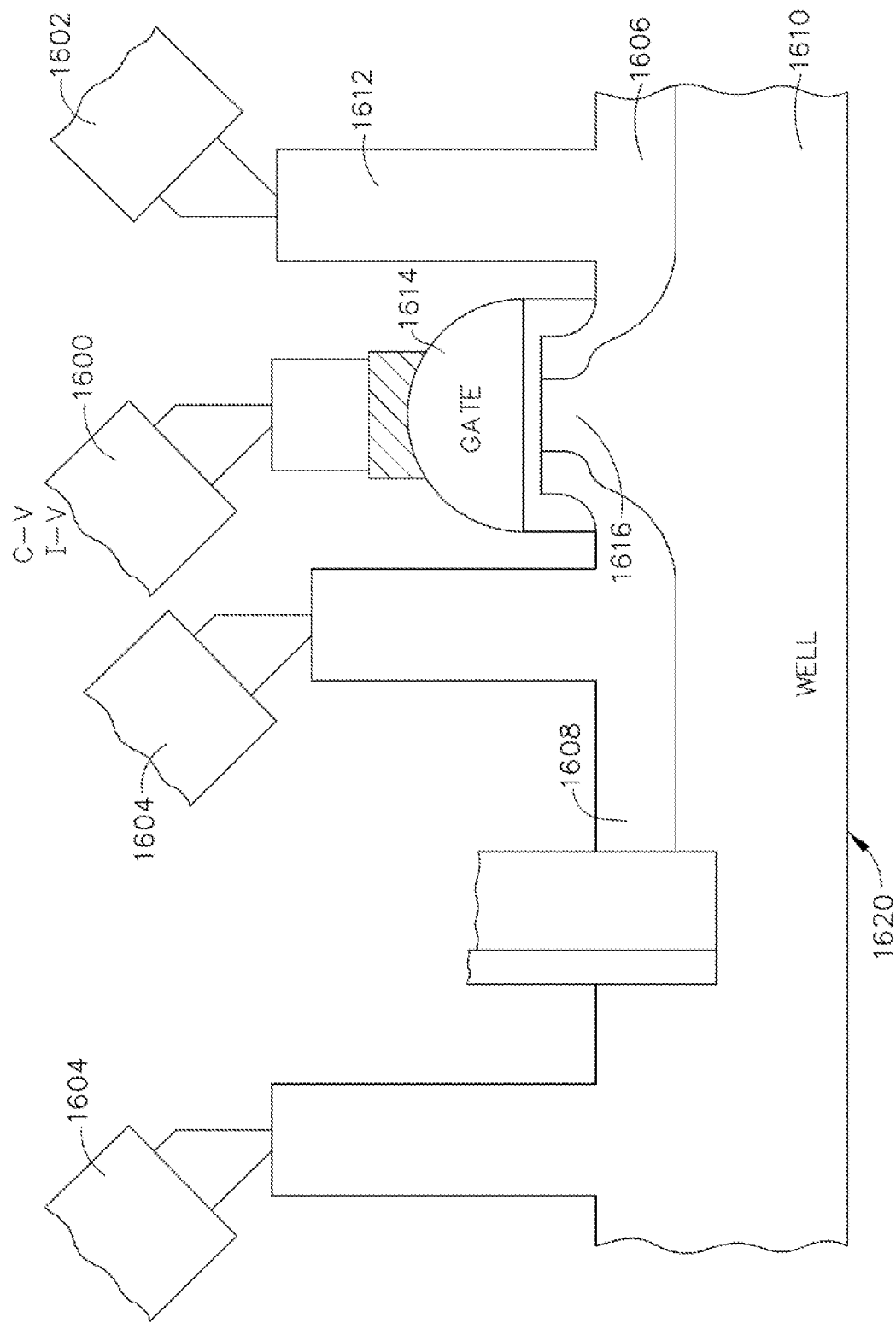
FIG. 16 is a depiction of a multiple probe measurement of a semiconducting MOSFET device using multiple probes which allows the measurement of the present invention to be directed to a specific area in the device such as the overlap between a gate and the source or drain.

FIG. 16 shows another embodiment in which, two or more probes 1600, 1602, 1604 are used to contact the terminals 1612 of a nanoscale semiconductor device such as a MOSFET 1620. The capacitance of the gate 1614 is profiled by changing the bias applied to the other terminals of the device. In this technique, some of the desired measurements are those of total gate capacitance, and capacitance relative to a source 1606, drain 1608, or channel 1616 which is profiled in depth using bias on either the gate or one or more of the other device terminals. The junctions of device 1620 are depleted, typically via reverse bias but also through forward biasing and changes in capacitance are measured. Charge in a device structure such as a channel 1616 or source underlapping a gate may be profiled using more than one probe. The other probes will effectively isolate the portions of the device for capacitive charge mapping by holding biases constant while other portions of the device are swept. Additionally and in combination using the circuit and configurations detailed in this disclosure, the current and charge profile of these structures can be profiled thereby yielding a two and three dimensional profile of the device property.

Because such measurements as described herein may be accomplished before full wafer processing has been completed, the device performance may be measured very early in the process. Typical semiconductor processes are completed to the point that test structures may be measured after between 40 and 200 processing steps. In a typical fabrication facility, the time involved will be several months. The present invention will enable measurements to be accomplished weeks into the process after a minimal number of steps. The improvement over the prior art is obtained through use of this early or rapid information in improving and monitoring process variability. Furthermore, the access to fast measurements of the performance of a semiconductor device allows for faster process development.

Figure 5A:
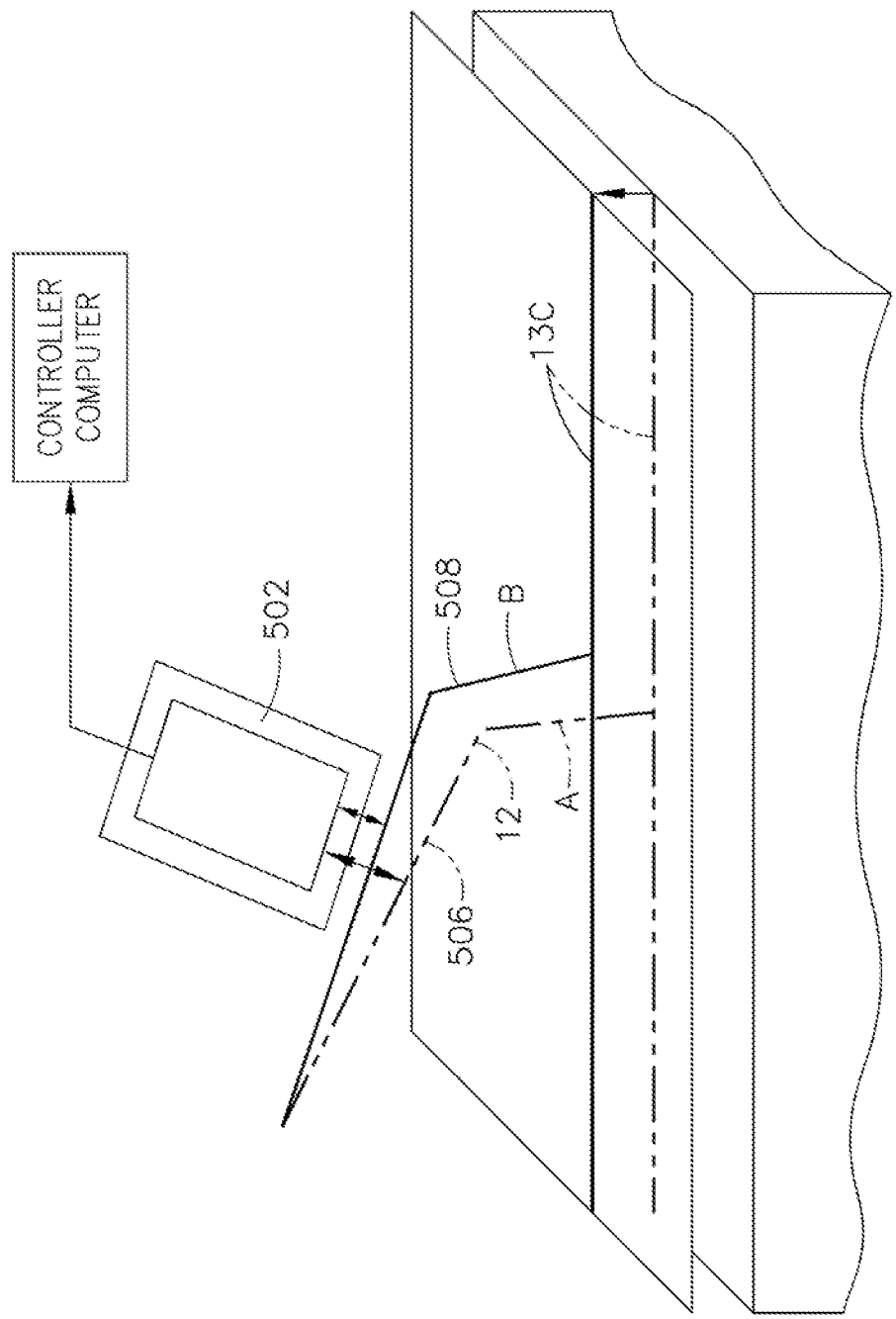
FIG. 5A is an example of probe control and detection of surface contact via capacitance measurement and stray capacitance subtraction according to the present invention.
Figure 5B:
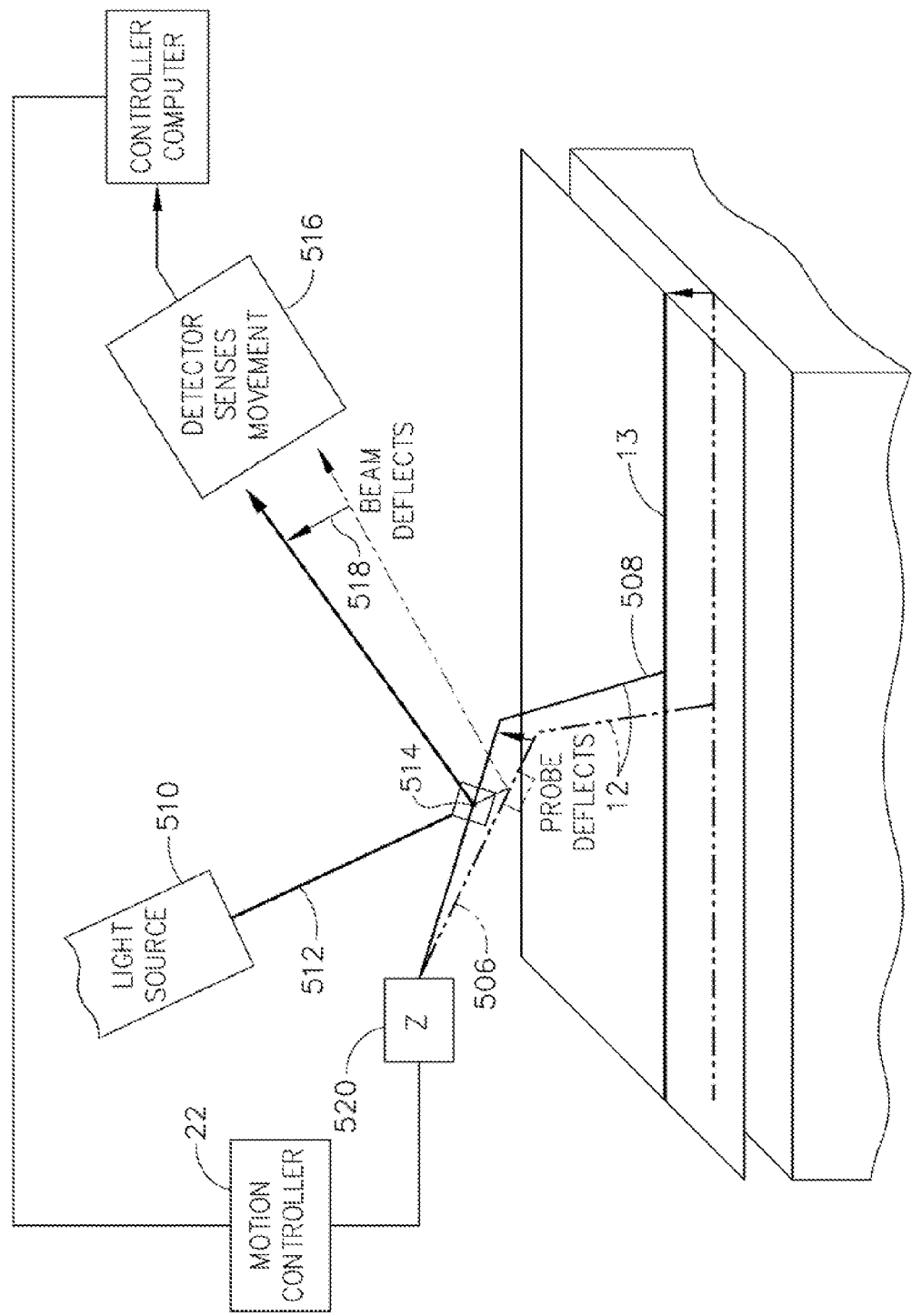
FIG. 5B is an example of implementation of optical lever detection combined with the method of capacitance detection for the purpose improving the accuracy of the present method.

As previously described with respect to FIG. 1, movement of the probe for engagement with the test surface is controlled by the computer control and display system 30. The position sensor 20 in exemplary embodiments is alternatively a force sensor or other mechanical technique, differential capacitance monitor, optical lever or optical interferometer for measuring beam deflection. FIG. 5a shows in block schematic form the operation of a differential capacitance sensor 502 which detects the capacitance of a probe support cantilever 504 in a "loose" position at a distance 506 (represented prior to contact in phantom) and a flexed position at a distance 508 (represented after contact). Similarly, operation of an optical lever sensor is shown in FIG. 5b wherein the position sensor incorporates a light source 510 producing a beam 512 which reflects from a reflector 511 on the probe support cantilever to a detector 516 identifying the beam deflection 518 created by the transition from the loose position (in phantom) to the flexed position.

Figure 6:
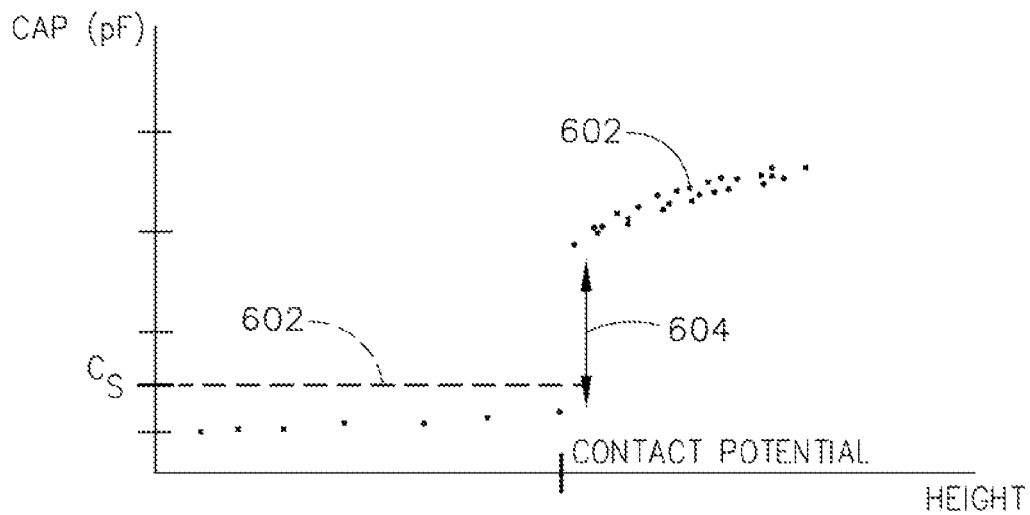
FIG. 6 shows the discontinuity in measured capacitance with probe touch down. The jump is used both as a measure of stray capacitance and to detect touch down.

Alternative position sensing using the capacitance measurement by the probe to sense contact with the test surface is employed in certain embodiments. As shown in FIG. 6 as the probe tip is brought into proximity with the surface, the measured capacitance 602 between the probe tip and the test sample surface displays a discontinuous increase 604 as the probe touches the sample surface. The probe contact is sensed by moving the probe and test sample together using the probe controller and translation stage as appropriate while monitoring capacitance data with the computer control and display system using a contact detection algorithm for sensing the discontinuity.

Employing the integral capacitance sensing available with the present invention for positioning the probe onto the sample surface provides the important advantage of not requiring probe scrubbing of the contact to form the electrical connection as required with traditional testing approaches where metal or poly mesa contacts deposited onto the test material are used to interface with the probe. This reduces the potential for damage of the probe or scratching the surface of the microcircuit when attempting to create an electrical contact. In addition, the probe does not damage the thin dielectric layer at the test point even after the probe has been raised and lowered repeatedly because the contact pressure is below the damage threshold for the oxide.

If the probe is large enough, standard capacitance and current measurement equipment may be used to measure the electrical parameters once the probe is in contact with the surface of the test wafer. Compared to the use of mesa structures, the apparatus and method of the present invention allows the bandwidth of the measurements to he lowered so that more time is given to the capacitance or current measurements at each discrete voltage value as the voltage is swept over the measurement range due to the smaller area of contact relative to deposited contact probing where the measured area may be as large as 100 μm². The probe described in FIG. 3 will create a contact size at least 1000 times smaller.

Figure 19:
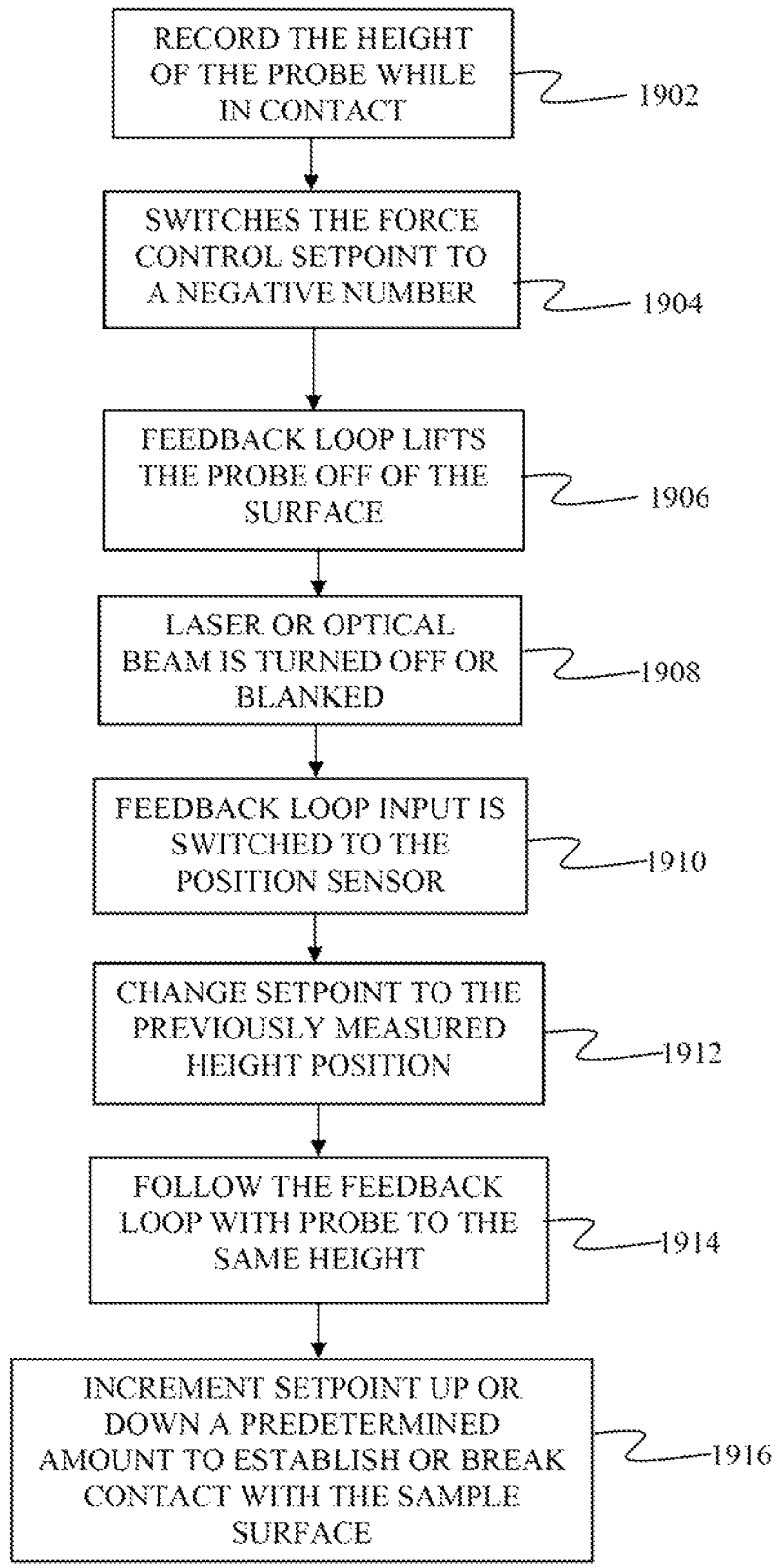
FIG. 19 is a flow chart of controlled probe placement using the height position.

A feedback loop diagram for measurements using an optical lever based technique of force control and probe contact sensing as exemplified in U.S. Pat. No. '833 by Amer and Myer. In force control feedback loop, the deflection of the optical beam is the input to the feedback loop and the output is connected to the Z actuator. The laser or super luminescent diode light typically employed in such schemes will cause errors in the measured CV and IV values due to photo generation effects in the semiconductor devices measured. Therefore it is advantageous to have a method of controlled probe placement using the height position measured by a position sensor at the point of contact and recorded by the controller computer. As shown in the flow chart of FIG. 19, in this method the computer controller first records the height of the probe while it is in contact 1902. Next it switches the force control setpoint to a negative number 1904 and the feedback loop lifts the probe off of the surface 1906. The laser or optical beam is turned off or blanked 1908 and then the feedback loop input is switched to the position sensor 1910 and the setpoint is changed to the previously measured height position 1912. The probe then follows the feedback loop 1914 to the same height as was measured in step 1902. Additionally, the setpoint may be incremented up or down a predetermined amount to establish or break contact with the sample surface 1916. By following this procedure, the probe can safely contact the sample surface without any photocurrents being generated.

Figure 7A:
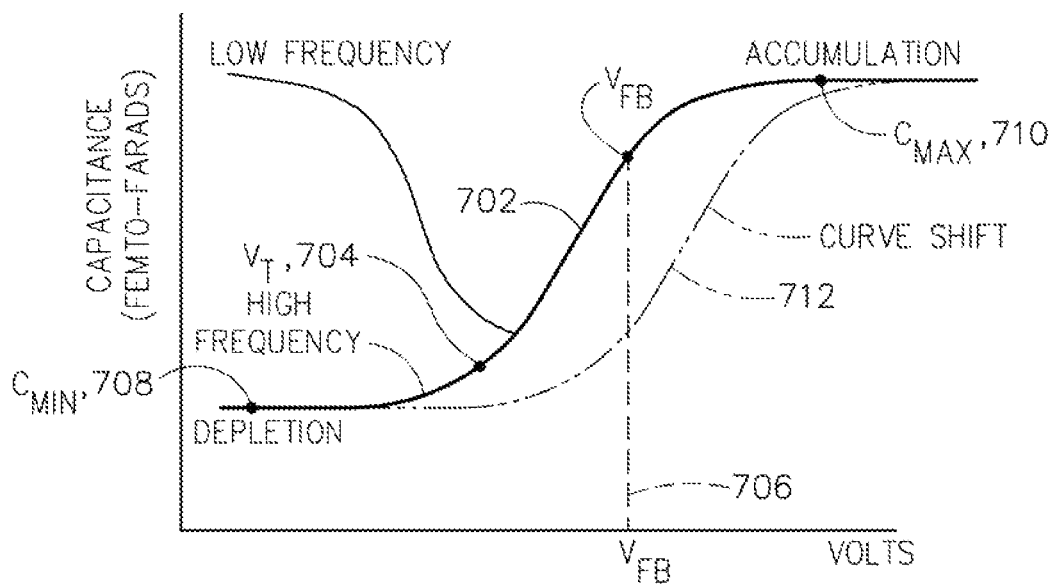
FIG. 7A shows a graph of the effect due to a flat band voltage shift on the CV curve. A measurement of the actual Vfb using capacitance measurement can be used to correct for a term in the equation for IV curves if the same probe is used.
Figure 7B:
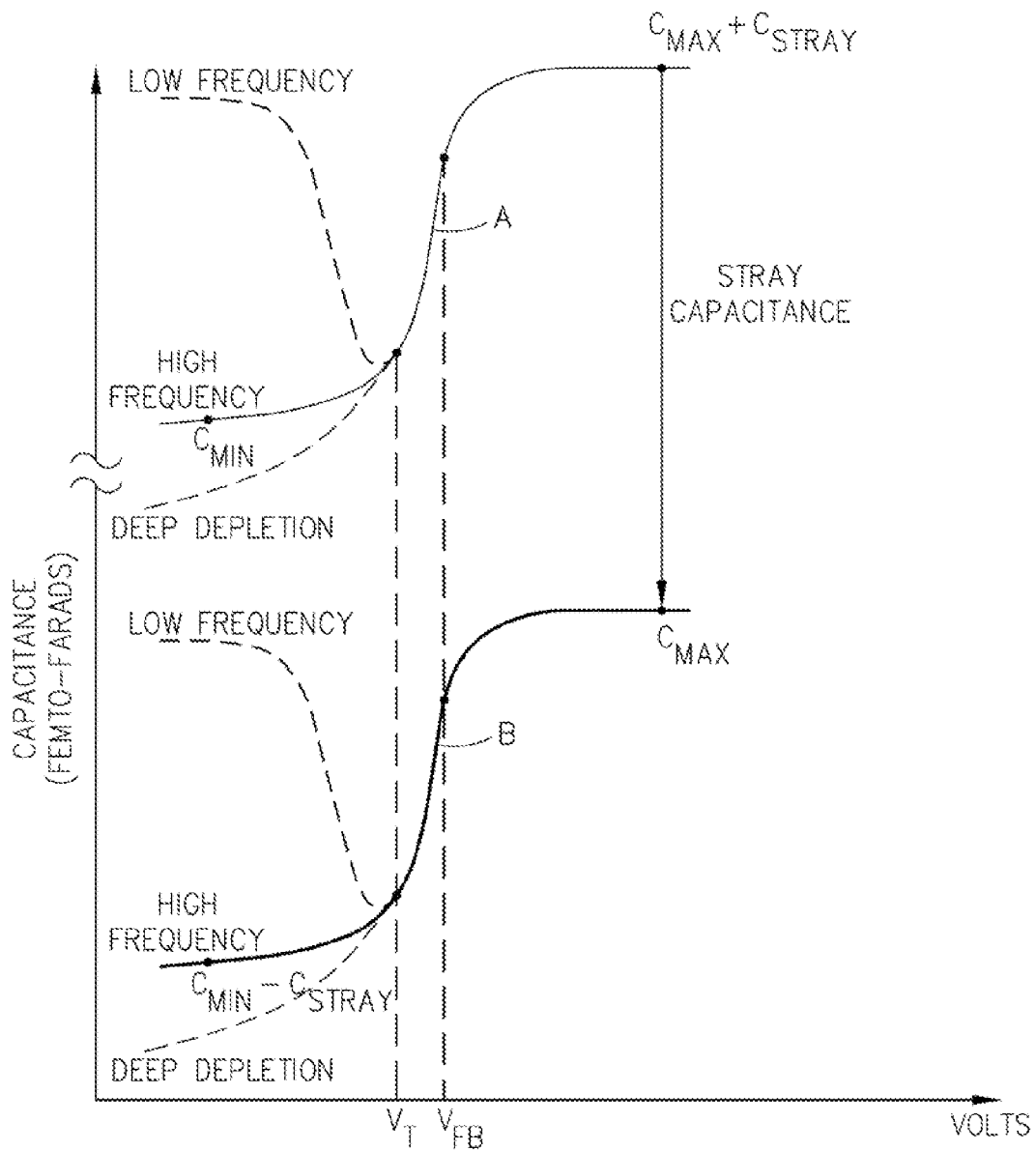
FIG. 7B shows correction of stray capacitance in accordance with the measurement shown in FIG. 6 wherein the corrected curve B will be far more useful in providing characterization of the DUT.

Testing of the semiconductor wafer is accomplished using the combined capability for capacitance measurements and measurement of the Fowler Nordheim tunneling or Frankel Pool emission currents individually to characterize the semiconductor and in conjunction with one another for correction of data. Referring to FIGS. 7A and 7B, measured capacitance data is used by the Computer controller and display system to construct C-V curves 702. Certain device parameters such as the threshold voltage (Vt) 704 and the flat band voltage (Vfb) 706 are obtained directly from the C-V curve as disclosed in "*The Role of C-V Profiling in Semiconductor Characterization*", Blight, Solid State Technology, April 1990, pp 175-179, which is incorporated herein by reference. Other parameters including doping profiles are derived from the values of Cmin 708 and Cmax 710 as well as from the slope and position of the curve. Mobile charge characteristics of the oxide layer are derived by heating the test material and monitoring the shifted C-V curve 712 as described in "MOS Physics and Technology", Nicollian and Brews, Wiley and Sons 1982, also incorporated herein by reference.

For the computer controller to obtain correct Cmax and Cmin values, correction for the probe stray capacitance must be made to realize full diagnostic potential of the measured data. For instance, the ratio of Cmin to Cmax is important and any additive constant will corrupt any calculation based upon these numbers. In previous test methods, subtraction of stray capacitance was insignificant because the capacitance to be measured was two to five orders of magnitude larger and therefore the probe capacitance in the femtoFarad range was insignificant. For current semiconductor architectures, the measured capacitance of the micro C-V curve is typically just a few tens of fF and the probe stray capacitance must be accounted for.

In certain embodiments of the present inventive method, a determination of stray capacitance is accomplished by use of a known calibration sample. The diameter of contact surface of the probe tip (as previously described with respect to FIG. 3) is measured and the capacitance value of the calibration sample is measured using the probe. A known thickness of oxide on the calibration sample allows calculation of expected capacitance from the probe contact diameter, oxide thickness and known dielectric constant of the calibration sample oxide. Subtraction of the calculated value from the measured capacitance yields the additional "stray" capacitance of the probe.

In alternative embodiments of the inventive method, the stray capacitance is measured as a portion of the probe positioning on the test sample as previously described with respect to FIG. 6. The capacitance value prior to the discontinuity at contact is Cstray of the probe. Subtraction of this value from the raw capacitance data by the computer control yields corrected values of capacitance-voltage. It should be noted that the critical voltage values such as Vt and Vfb are independent of the stray capacitance correction.

Further correction of capacitance data for non-ideal fringing effects arising due to the lack of approximation by the probe of the infinite plate capacitor due to the finite contact surface area. The fringing effects decrease as the aspect ratio of dielectric thickness to surface area decreases, however, for increased accuracy in capacitance measurement, correction by known methods such as a finite element simulator by the computer controller during data calculation may be employed, in various embodiments of the invention.

The Fowler Nordheim tunneling current is measured by the present invention for calculation of oxide thickness in various test measurements as will be described subsequently. The FN tunneling current is determined by $$I = A_{eff} \frac{e^3}{8\pi\hbar\phi} \left(\frac{V}{s}\right)^2 \exp\left(\frac{8\pi\sqrt{2m_{eff}}}{3\hbar e} \frac{\phi^{3/2} s}{V}\right)$$

where I is the current, V the potential applied across the dielectric, $\phi$ is the barrier height of the oxide, $m_{eff}$ is the effective mass of an electron in the dielectric material, $A_{eff}$ is the effective emission area, s is the dielectric thickness and η is plank's constant and e the charge on an electron.

Figure 8:
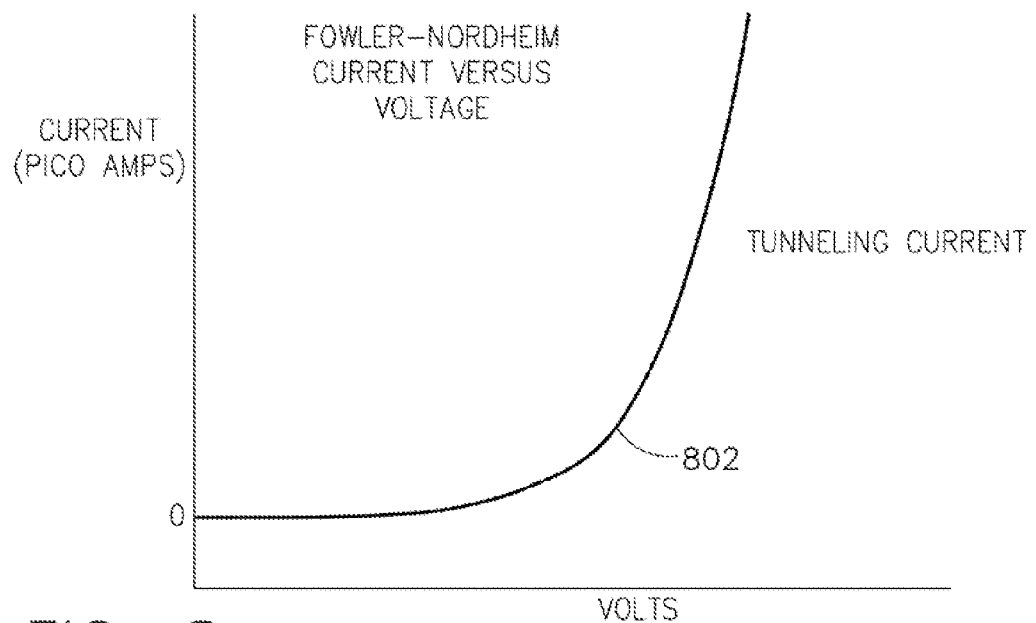
FIG. 8 is a plot of the exponential behavior of Fowler Nordheim tunneling current versus voltage in accordance with the prior art of such measurements.

The FN current, I, is not highly sensitive to the small changes of radius variation of the probe tip contact $A_{eff}$ which allows use of the measured current for correction of the contact area of the probe tip as will be described subsequently. Curve 802 representing FN current measurement is shown in FIG. 8 is known in the art.

Figure 9:
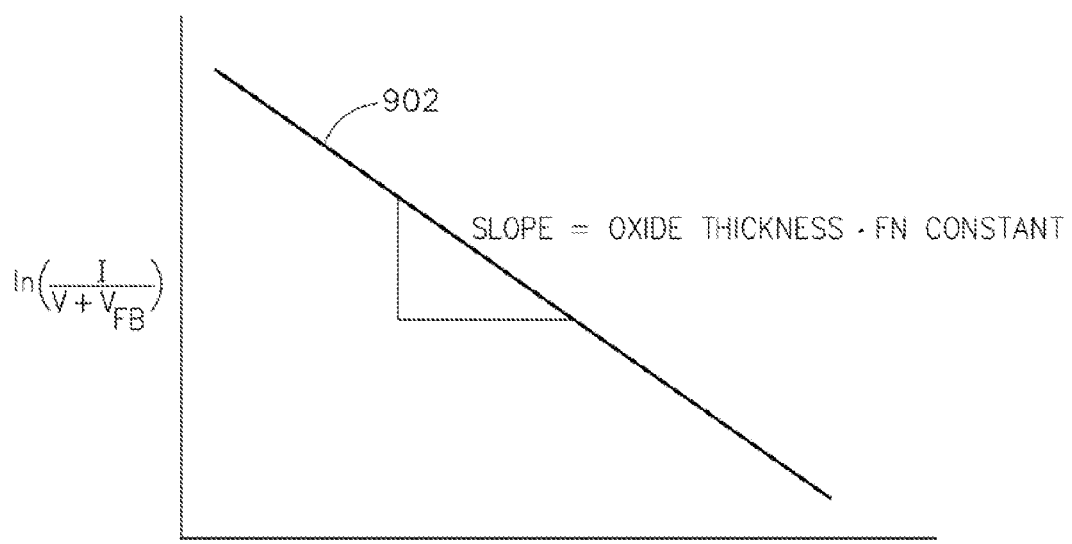
FIG. 9 is a plot of the same current in logarithmic form versus the reciprocal of voltage.

Referring to FIG. 9, The Fowler Nordheim tunneling current, I, is employed for calculating the slope of the curve ln(I/(V+Vfb)) vs. 1/V 902 where V is the voltage applied to the oxide by the in the test sample by the voltage supply 24, Vfb is the flat band voltage determined from the C-V curves as previously described. The slope defines the oxide thickness proportional to the empirically determined Fowler Nordheim constant, Cfn as $$T_{ox} = \ln(I/(V+V_{fb}))^2/C_{fn}(1/V)$$

Use of the FN concept of quantum effect current tunneling through an insulator has been used by those skilled in the art to measure oxide thicknesses for thicker films. However, with such thick films, the ln(I/V2) vs. (1/V) curve produced sufficiently accurate results without correction since applied voltage could be large (>>Vfb). The flat band voltage as measured in the CV curve is a compilation of all of the factors such as Shottkey effect barrier lowering, metal-silicon work function difference, fixed and mobile carrier concentrations, oxide traps, field enhancement effects at the probe tip and effect that are well known to those skilled in the art. In current architectures where oxide thickness is small, the applied voltage must be below a few volts and may be in the millivolt range to prevent damage to the oxides and correction for the flat band voltage, Vfb, is required. The calculation of Tox, in turn, allows calculation of the effective contact area of the probe, Ac, as $$A_c = (C_{max} T_{ox})/\epsilon_{ox}$$

which is then employed for correction of the C-V data for increased accuracy of the capacitance measurement. Recall that determination of Vfb used in the FN calculations is independent of the stray capacitance which affects the absolute magnitude of the capacitance values.

Figure 10:
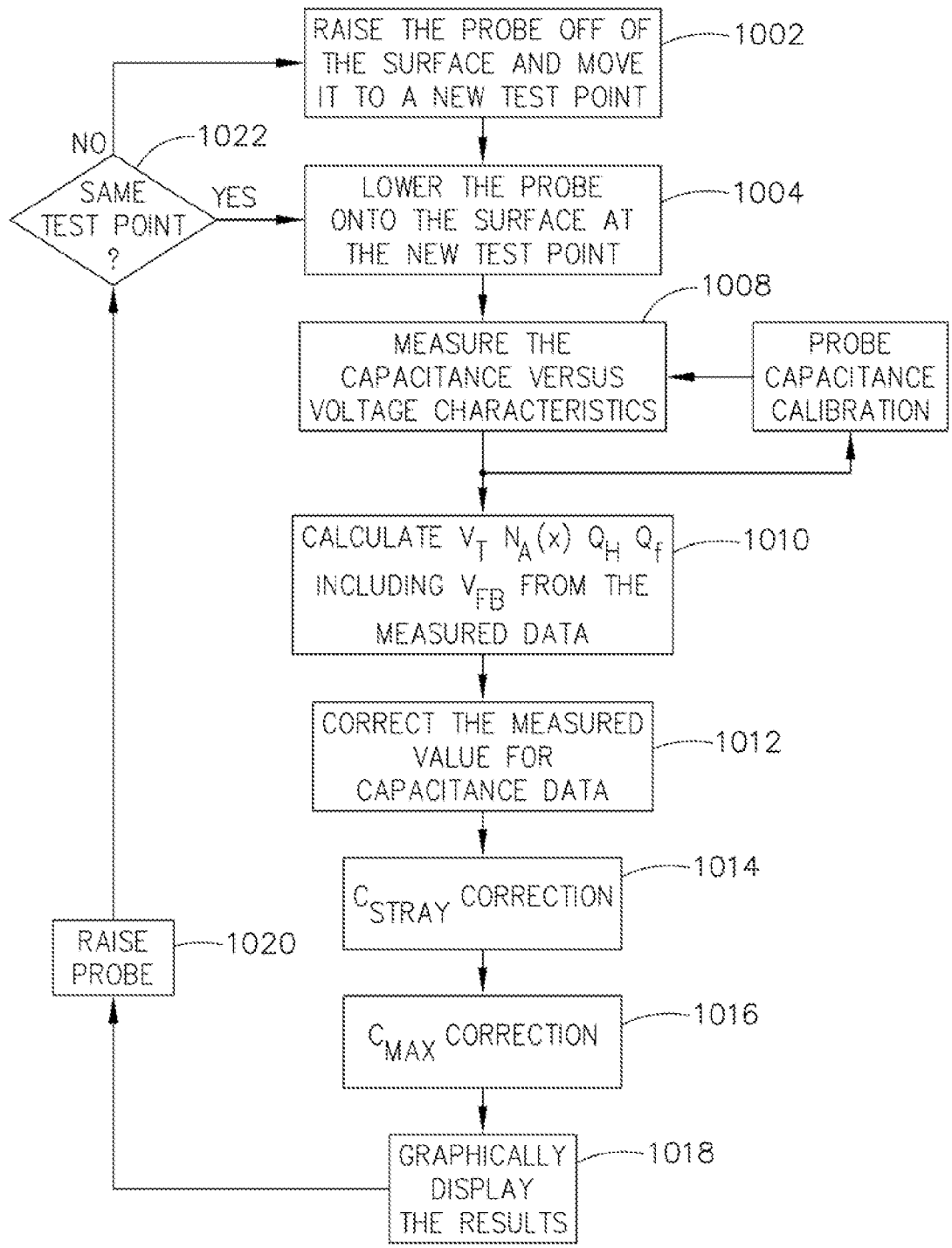
FIG. 10 is a flow chart in accordance with the method of using CV and IV measurements to correct for errors found in nanoscale measurements.

The operation of the computer controller and display for data collection and correction as described above, is accomplished as shown in FIGS. 10-14. To accomplish the test regimen, a sample is mounted on the test plate and roughly positioned using the translation stage. A combination of a translation stage and coarse positioning system to which the probe controller is attached is employed in alternative embodiments. Referring to FIG. 10, the probe is positioned over a desired test point 1002 and lowered employing the probe controller, monitoring for contact 1004 using one of the contact sensor techniques previously described as input. After contacting the test wafer, voltage is applied from the voltage source and capacitance versus voltage characteristics are generated 1008. Vfb is calculated 1010 for use in the FN current measurement which is described with respect to FIG. 11. Correction of the capacitance data is made 1012 using Cstray correction 1014 by one of the techniques previously described and Cmax correction from the FN current measurement data 1016. The C-V results are then graphically displayed 1018 and the probe is then raised from the sample 1020. If additional data is desired from the same test point 1022, the computer control returns to step 1004 otherwise, the computer control selects the next test point and returns to step 1002.

Figure 11:
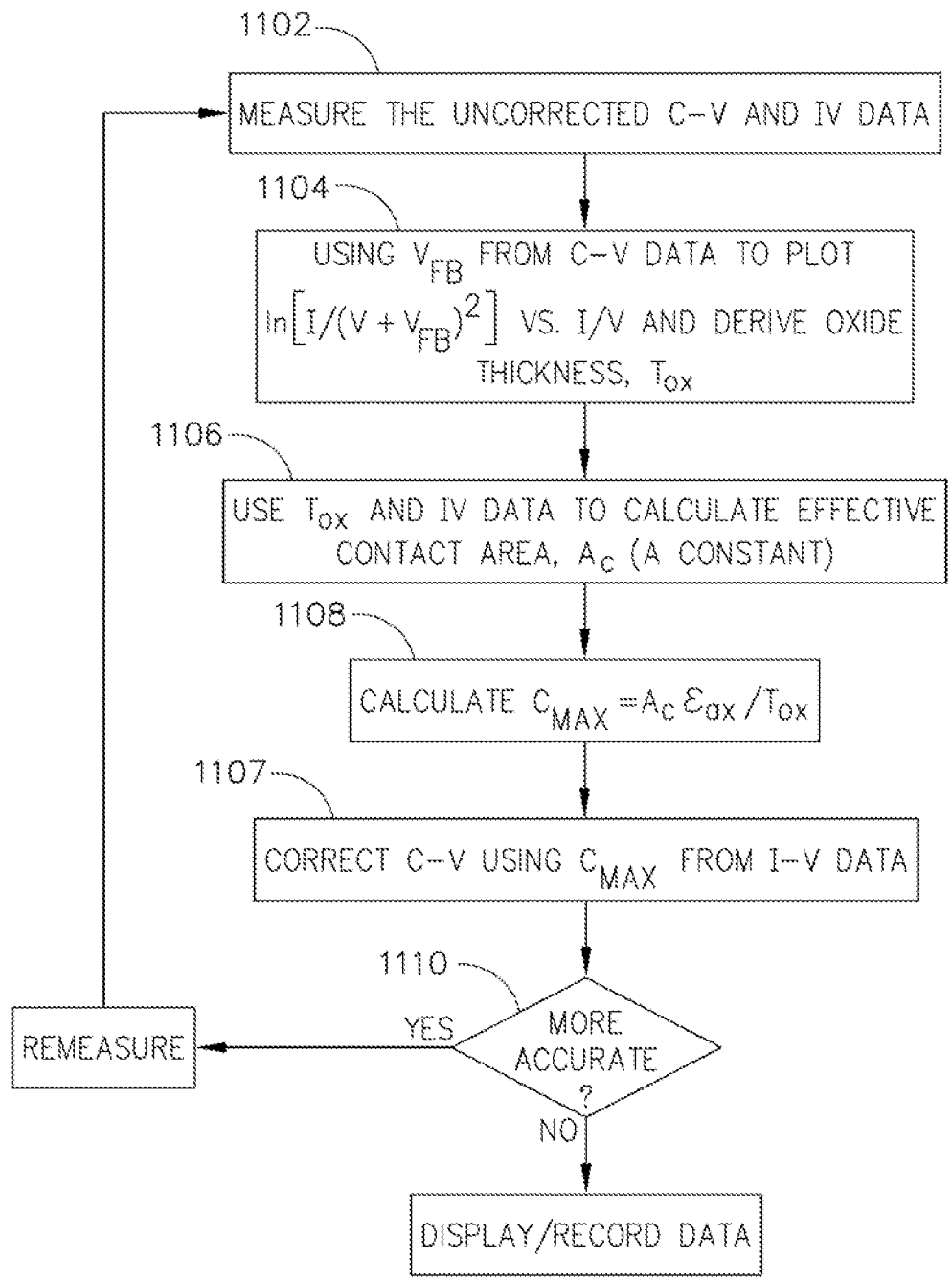
FIG. 11 is a flow chart according to the method of using CV and IV measurements to improve the accuracy of nanoscale measurements.

Referring to FIG. 11, the FN current is measured during application of the voltage to the test sample by the voltage supply 1102. Using Vfb as calculated from the C-V data, the computer control calculates and plots ln(I/(V+Vfb)) vs. 1/V and derives the oxide thickness, Tox, 1104. Tox and the I-V data are then employed to calculate the contact area, Ac, of the probe 1106 from which Cmax is calculated as $C_{max} = A_c \epsilon_{ox}/T_{ox}$ 1108 for correction of the C-V data. If greater accuracy of the data is desired 1110, the computer control returns to step 1102, if not, the data and calculations are displayed and recorded 1112.

Figure 12:
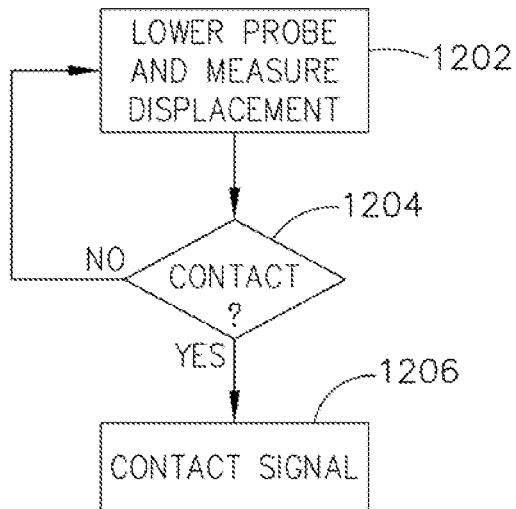
FIG. 12 is a flow chart to show the method of contacting the surface of a sample using force displacement.
Figure 13:
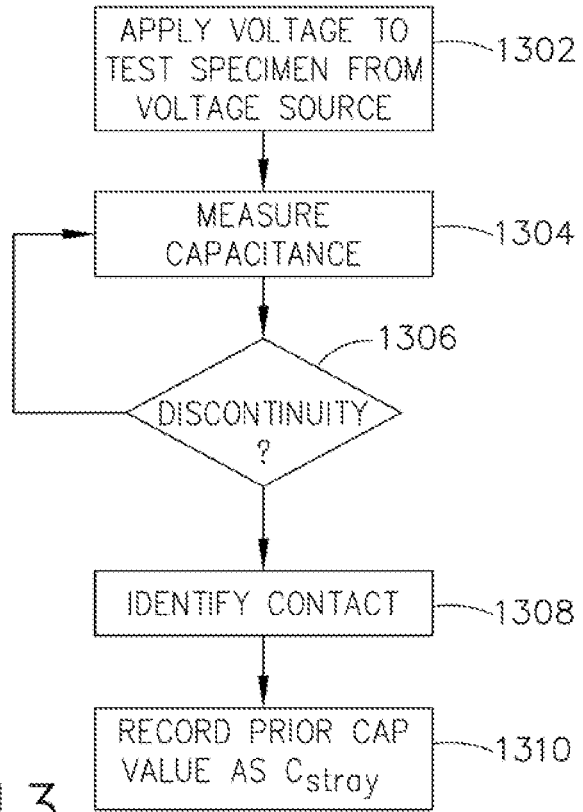
FIG. 13 is a flow chart t show the method of measuring a capacitance discontinuity to detect contact with the surface of a sample.

FIG. 12 shows a first probe contact detection using the position sensor for control. The mechanical, optical or capacitance sensors previously described are applicable in various embodiments for the method. As the probe is lowered by the probe controller, the sensor measures for displacement of the cantilever 1202. If displacement is detected 1204, a contact signal is sent to the computer control 1206. If displacement is not detected, sensor measurement is continued., FIG. 13 demonstrates the use of the measured capacitance discontinuity as the probe contact detector. Voltage is applied to the test specimen using the voltage source 1302. The capacitance is measured by the probe 1304 and a comparison with prior value within specified tolerances is applied 1306. If the comparison indicates the discontinuity has been reached, a contact is identified by the computer control 1308 and capacitance value prior to the discontinuity is recorded as Cstray 1310. If not, capacitance measurement is continued.

Figure 14:
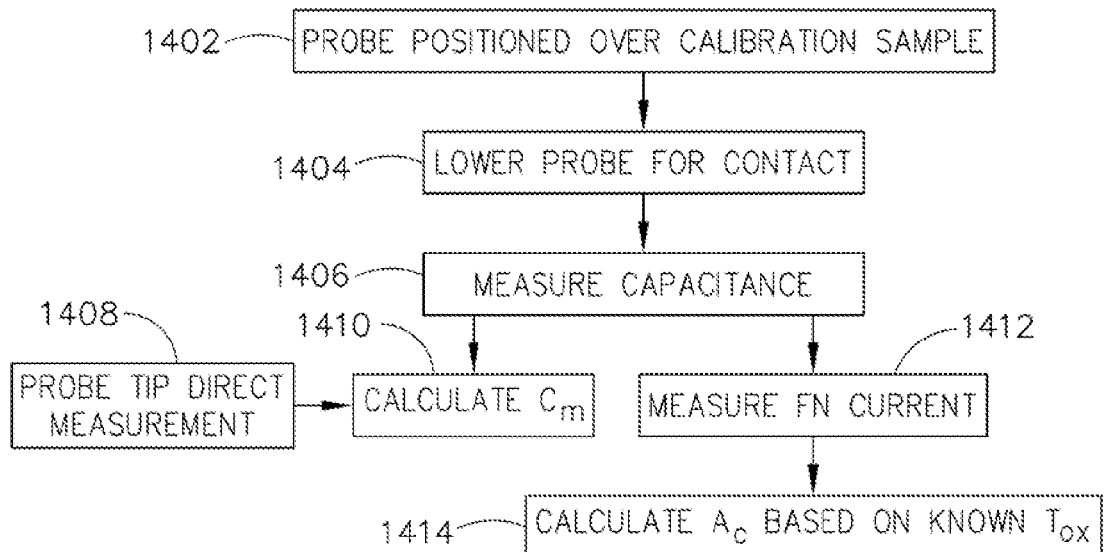
FIG. 14 is a flow chart showing the steps of calibration of a probe for measurements of the present invention.

FIG. 14 shows a calibration routine employing a test sample of known oxide thickness and characteristics for correction of Cstray. The probe is positioned over the calibration sample 1402 and lowered for contact 1404. Capacitance, Cp, is measured 1406. For embodiments of the invention in which the contact area, Ac, of the probe tip is directly measured 1408, a value of the capacitance, Cm, for the calibration sample is calculated as Cm=Ac D/t where D is the known dielectric constant of the calibration sample and t is the known oxide thickness, and the stray capacitance is calculated as Cstray=Cp−Cm 1410. In alternative embodiments, FN current is measured 1412 and with known oxide thickness, Tox, Ac is then calculated 1414 using the calibration sample characteristics.

Figure 15:
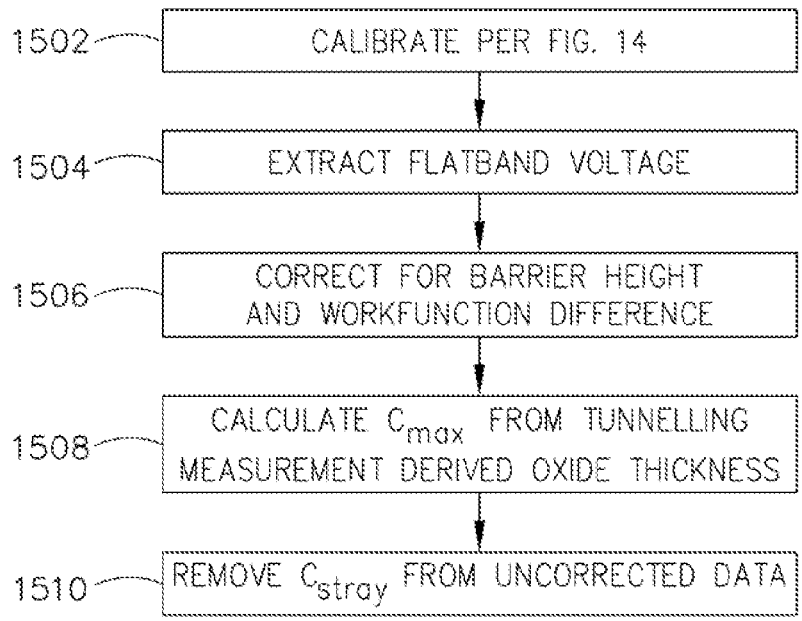
FIG. 15 shows the steps of using a probe as calibrated in FIG. 14 to measure an unknown sample with higher accuracy.

FIG. 15 shows an exemplary method for using both CV and IV data in their uncorrected state to extract corrected values for each. As is well known and described above, traditional methods for extraction of device or material properties from C-V curves fail if the area and oxide thickness are not known and any significant stray capacitances are not removed from the measurement. Furthermore, dielectric properties such as thickness fail if parameters such as probe area and tunneling barrier height. Conveniently, if the effective probe contact area can be calibrated 1502 on a known calibration sample as described above, then according to the method shown in the flow chart, the flatband voltage can be extracted from the uncorrected capacitance data 1504 and used to correct the current data for the unknown values of barrier height and work function difference 1506. The corrected tunneling measurement then provides oxide thickness allowing the Cmax value to be calculated 1508 and then Cstray removed from the uncorrected capacitance data 1510. Thus one may use the combination of these data in order to enable far smaller contact area measurements to be taken according to the present invention. Further corrections include but are not limited to the significant effect that leakage currents have upon capacitance-voltage measurements. The IV curve represents the value of leakage current present in the CV measurements and therefore may also be subtracted out.

The apparatus and method of the present invention are employed on probe stations having multiple probes for characterization of features on a test wafer as represented in FIG. 16. C-V and I-V data determined for each probe as described above allows comparison of multiple features as an inspection tool.

Figure 17:
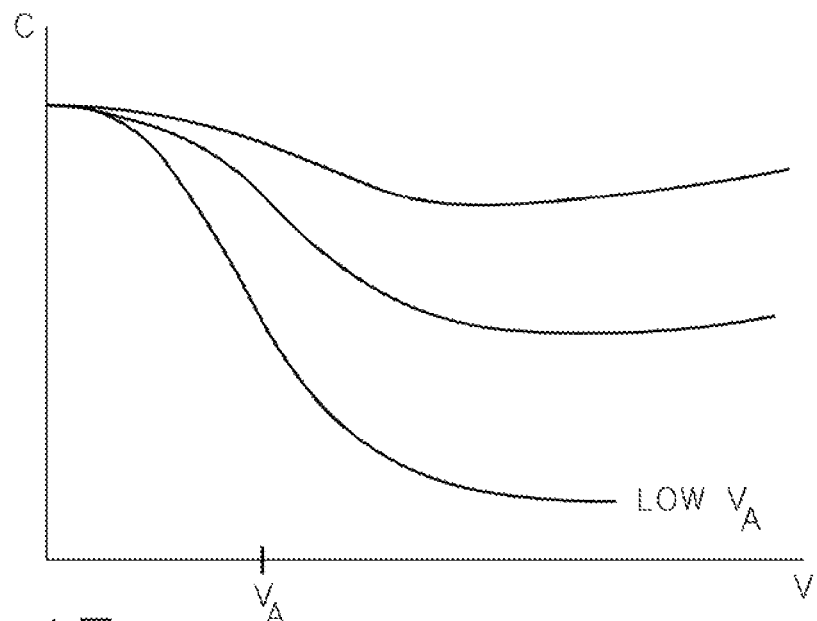
FIG. 17 shows measured high frequency capacitance curves relative to changes in impurity concentration.
Figure 18:
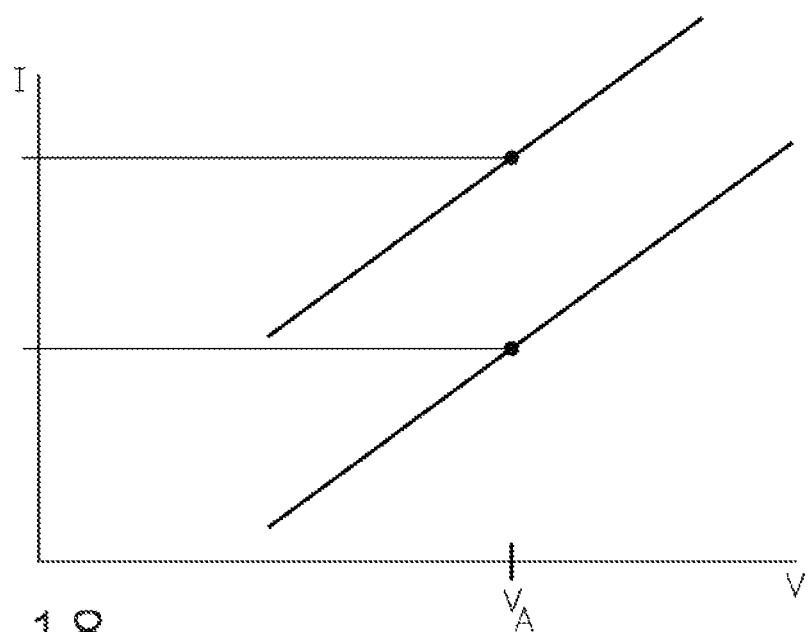
FIG. 18 shows tunneling IV data taken on two different oxide thicknesses.

Selection of consecutive test points on the wafer or substitution of a profile detection routine using the position sensor to allow direct scanning by the probe on the test sample allows the method and apparatus of the present invention to be employed in Scanning Capacitance Microscopy (SCM) applications for measuring parameters such as variation of doping of the oxide based on varying slope of the C-V curves calculated as shown in FIG. 17. Similarly, the I-V measurements accomplished are employed in Scanning Tunneling Microscopy (STM) applications as shown in FIG. 18.

Having now described the invention in detail as required by the patent statutes, those skilled in the art will recognize modifications and substitutions to the specific embodiments disclosed herein. Such modifications are within the scope and intent of the present invention as defined in the following claims.

What is claimed is:

1. A semiconductor testing device for concurrently measuring capacitance and current, comprising:
   a probe with a tip for contacting a surface on a semiconductor device, the probe tip configured as one plate of a capacitor to thereby define a test structure for testing capacitance between the probe tip and an extrinsic region of the semiconductor;
   means for positioning the probe tip to a desired measurement point;
   means for detecting contact by the probe tip on the surface;
   means for supplying test voltage to the semiconductor device;
   a capacitance measuring circuit for measuring the capacitance between the probe tip and the extrinsic region of the semiconductor as sensed by the probe based on the test voltage, and including a resonator having a central resonator electrically connected to the probe tip through a transmission line;
   a current sensing circuit for measuring Fowler Nordheim current sensed by the probe based on the test voltage;
   where said capacitance measuring circuit and current sensing circuit are in different frequency bands and are isolated by means of an inductor; and,
   wherein the probe includes a cantilever support and the contact sensing means comprises a capacitive sensor monitoring flexure of the cantilever support.

2. A semiconductor testing device as defined in claim 1 wherein the cantilever support is a metal foil cantilever.

3. A semiconductor testing device as defined in claim 2 wherein the probe is of dissimilar material than the metal foil cantilever.

4. A semiconductor testing device as defined in claim 1 wherein the resonator and transmission line are surrounded by an RF return.

5. A semiconductor testing device as defined in claim 4 wherein the RF return is a guard for the current measurement.

6. A semiconductor testing device as defined in claim 5 wherein the resonator is a ¼ λ dielectric resonator.

7. A semiconductor testing device as defined in claim 1 wherein the means for positioning the probe comprises a probe controller.

8. A semiconductor testing device as defined in claim 7 wherein the probe controller comprises an atomic force microscope (AFM).

9. A semiconductor testing device as defined in claim 4 wherein the means for positioning further comprises a translation stage incorporating a test plate on which the wafer is mounted.

10. A semiconductor testing device as defined in claim 1 wherein the probe includes a cantilever support and the contact sensing means comprises an optical lever.

11. A semiconductor testing device for concurrently measuring capacitance and current, comprising:
    a probe with a tip for contacting a surface on a semiconductor device, the probe tip configured as one plate of a capacitor to thereby define a test structure for testing capacitance between the probe tip and an extrinsic region of the semiconductor;
    means for positioning the probe tip to a desired measurement point;
    means for detecting contact by the probe tip on the surface;
    means for supplying test voltage to the semiconductor device;
    a capacitance measuring circuit for measuring the capacitance between the probe tip and the extrinsic region of the semiconductor as sensed by the probe based on the test voltage, and including a resonator having a central resonator electrically connected to the probe tip through a transmission line;
    a current sensing circuit for measuring Fowler Nordheim current sensed by the probe based on the test voltage;
    where said capacitance measuring circuit and current sensing circuit are in different frequency bands and are isolated by means of an inductor;
    wherein the contact sensing means comprises:
       means for monitoring the capacitance measuring means during operation of the positioning means to bring the probe into contact with the surface; and
       means for detecting a discontinuity in measured capacitance.

12. A semiconductor testing device for concurrently measuring capacitance and current, comprising:
    a probe with a tip for contacting a surface on a semiconductor device, the probe tip configured as one plate of a capacitor to thereby define a test structure for testing capacitance between the probe tip and an extrinsic region of the semiconductor;
    means for positioning the probe tip to a desired measurement point;
    means for detecting contact by the probe tip on the surface;
    means for supplying test voltage to the semiconductor device;
    a capacitance measuring circuit for measuring the capacitance between the probe tip and the extrinsic region of the semiconductor as sensed by the probe based on the test voltage, and including a resonator having a central resonator electrically connected to the probe tip through a transmission line;
    a current sensing circuit for measuring Fowler Nordheim current sensed by the probe based on the test voltage;
    where said capacitance measuring circuit and current sensing circuit are in different frequency bands and are isolated by means of an inductor;
    wherein the current sensing circuit operates at frequency below 1000 Hz and the capacitance measurement circuit operates at two separate frequencies.

13. A semiconductor testing device as defined in claim 12, wherein the capacitance measuring circuit operates at one frequency of 1 GH and at a second frequency from 1 kHz to 10 MHz.

14. A semiconductor testing device for concurrently measuring capacitance and current, comprising:
    a probe with a tip for contacting a surface on a semiconductor device, the probe tip configured as one plate of a capacitor to thereby define a test structure for testing capacitance between the probe tip and an extrinsic region of the semiconductor;
    means for positioning the probe tip to a desired measurement point;
    means for detecting contact by the probe tip on the surface;
    means for supplying test voltage to the semiconductor device;
    a capacitance measuring circuit for measuring the capacitance between the probe tip and the extrinsic region of the semiconductor as sensed by the probe based on the test voltage, and including a resonator having a central resonator electrically connected to the probe tip through a transmission line;

a current sensing circuit for measuring Fowler Nordheim current sensed by the probe based on the test voltage;

where said capacitance measuring circuit and current sensing circuit are in different frequency bands and are isolated by means of an inductor;

wherein the capacitance measuring circuit comprises a voltage controlled oscillator, and RF amplifier, detector stripline, a rectifier, and a low pass filter, wherein the output of the filter corresponds to the capacitance value sensed by the probe tip.

* * * * *